United States Patent
Ohara et al.

[11] Patent Number: 5,981,049
[45] Date of Patent: Nov. 9, 1999

[54] COATED TOOL AND METHOD OF MANUFACTURING THE SAME

[75] Inventors: Hisanori Ohara; Hiroshi Arimoto; Reizo Murakami; Nobuyuki Kitagawa; Kazuo Noguchi; Yasutaka Okada, all of Hyogo, Japan

[73] Assignee: Sumitomo Electric Industries, Ltd., Osaka, Japan

[21] Appl. No.: 08/974,522

[22] Filed: Nov. 20, 1997

[30] Foreign Application Priority Data

Dec. 4, 1996 [JP] Japan ................................ 8-324067
Feb. 20, 1997 [JP] Japan ................................ 9-036567

[51] Int. Cl.$^6$ .................................................. B32B 7/02
[52] U.S. Cl. .............................. 428/216; 51/295; 51/307; 51/309; 427/248.1; 427/255.2; 427/255.3; 427/255.7; 427/585; 428/212; 428/336; 428/457; 428/469; 428/472; 428/697; 428/698; 428/699; 428/701; 428/702; 204/192.1; 204/192.15; 204/192.16
[58] Field of Search ...................... 428/469, 472, 428/698, 697, 699, 216, 336, 272, 701, 702; 51/295, 307, 309; 427/585, 248.1, 255.2, 255.3, 255.7; 204/192.1, 192.15, 192.16

[56] References Cited

U.S. PATENT DOCUMENTS

| | | |
|---|---|---|
| 4,284,687 | 8/1981 | Dreyer et al. . |
| 4,447,263 | 5/1984 | Sugizawa et al. ........................ 428/469 |
| 4,714,660 | 12/1987 | Gates, Jr. .................................. 428/699 |
| 4,753,854 | 6/1988 | Gavrilov et al. .......................... 428/698 |
| 4,842,710 | 6/1989 | Freller et al. ........................ 204/192.38 |
| 5,208,102 | 5/1993 | Schulz et al. ............................. 428/336 |

FOREIGN PATENT DOCUMENTS

| | | |
|---|---|---|
| 55-76061 | 7/1980 | Japan . |
| 60-248879 | 12/1985 | Japan . |
| 61-294659 | 12/1986 | Japan . |

OTHER PUBLICATIONS

Growth of single–crystal TiN/VN strained–layer superlattices with extremely high mechanical hardness; U. Helmersson et al.; pp. 481–484; J.Appl.Phys., 62(w) Jul. 15, 1987.

*Primary Examiner*—Archene Turner
*Attorney, Agent, or Firm*—W. F. Fasse; W. G. Fasse

[57] ABSTRACT

A coated tool includes a base material and a wear-resistant coating film formed on the base material. The composition of the wear-resistant coating film is expressed as $(Ti_x Al_y V_z)(C_u N_v O_w)$. Relations $x+y+z=1$, $u+v+w=1$, $0.2<x<1$, $0 \leq y<0.8$, $0.02 \leq z<0.6$, $0 \leq u<0.7$, $0.3<v \leq 1$ and $0 \leq w<0.5$ hold between x, y, z, u, v and w. The thickness of the wear-resistant coating film is at least 0.5 μm and not more than 15 μm. A coated cutting tool in particular includes a base material consisting of cemented carbide and a wear-resistant coating film formed on the surface of the base material. The wear-resistant coating film includes a titanium nitride film which is formed to be in contact with the surface of the base material, and a composite nitride film, formed on the titanium nitride film, containing titanium, vanadium, nitrogen and an unavoidable impurity or titanium, aluminum, vanadium, nitrogen and an unavoidable impurity, or a composite carbo-nitride film, formed on the titanium nitride film, containing titanium, vanadium, carbon, nitrogen and an unavoidable impurity or titanium, aluminum, vanadium, carbon, nitrogen and an unavoidable impurity. The outermost surface of the wear-resistant coating film is coated with a low melting point oxide, containing vanadium oxide, having a melting point of not more than 1000° C.

29 Claims, 2 Drawing Sheets

COATED TOOL AND METHOD OF MANUFACTURING THE SAME

BACKGROUND OF THE INVENTION

1. Field of the Invention

The present invention relates to a coated tool provided with a wear-resistant coating film on its surface, and more particularly, it relates to a coated cutting tool employed for milling, turning, drilling and the like, and a coated tool such as a coated mold, punch and die employed for metal forging, punching, pressing and the like.

2. Description of the Background Art

In recent years, new tool materials have been developed one after another, in order to satisfy a requirement for higher efficiency and higher precision of working. In the process of such material development, techniques of coating various tool materials with ceramics for manufacturing the so-called coated tools are indispensable. As a recent trend, working speeds are now increasing, in order to improve working efficiency. As a result, ceramics coating films provided on surfaces of such tools become remarkably worn.

In order to suppress such wear, titanium ceramics such as titanium carbide (TiC), titanium nitride (TiN) or titanium carbo-nitride (Ti(C,N)) are most generally employed as a component of a ceramics coating film for a cutting tool, for example. Further, there has been developed a method of improving wear resistance and oxidation resistance of such a ceramics coating film by adding aluminum into the titanium ceramics material. Thus, titanium aluminum nitride ((Ti,Al)N) is now coming into wide use as the material for a ceramics coating film.

When such a coating film is formed on a coated cutting tool, however, the material being cut (hereinafter referred to as a workpiece) is disadvantageously deposited onto the ceramics coating film around the insert of the tool to induce chipping, the so-called deposition chipping, of the insert. Such deposition chipping takes place conceivably because the adhesion force between the ceramics coating film serving as a wear-resistant coating and the deposit is so high that the deposit grows on the cutting edge to cause a phenomenon such as remarkable chipping on the forward end portion of the insert.

In perforation work using a drill provided with a ceramics coating film, on the other hand, effusion resistance of swarfs is increased to break the drill particularly in case of drilling a deep hole.

In order to solve these problems, a tool prepared by depositing a lubricative coating consisting of a layer compound such as molybdenum disulfide on a wear-resistant coating film has been proposed and put on the market. In such a tool, the layer compound such as molybdenum disulfide is easily worn due to low mechanical strength. Immediately after starting of cutting, therefore, the problem such as deposition chipping or increased effusion resistance is hardly caused, due to the lubricative action of molybdenum disulfide. However, the quantity of molybdenum disulfide is reduced with progress of cutting, to readily cause the problem of deposition chipping or increase of effusion resistance of swarfs.

In order to suppress such deposition chipping or increase of effusion resistance of swarfs, therefore, a large quantity of cutting fluid is generally employed during cutting. However, such employment of the cutting fluid leads to an environmental problem. In case of working a deep hole with a drill, further, it is difficult to feed such a cutting fluid to the forward end portion of its insert. Thus, a tool which can withstand high-speed cutting with no cutting fluid is needed.

Also in relation to a mold, a technique of coating its base material with ceramics is indispensable. As the recent trend, further, warm or hot forging is now coming into use, in order to implement improvement of working accuracy or reduction of a lubricant coating step. Thus, wear of the mold material is remarkable.

In order to suppress such wear, the ceramics coating film for the mold is prepared from a component similar to that for the cutting tool. However, such a ceramics coating film is inferior in lubricity, although the same is effective for improving wear resistance. Therefore, a technique of forming a bonderizing film on the workpiece or using lubricating oil, graphite or a boric acid lubricant during working is employed.

The term "bonderizing" indicates formation of a zinc phosphate coating film on the surface of a workpiece. Thus, it is possible to suppress the so-called galling of the workpiece and the mold material during cold forging. However, the surface of the mold material must be cleaned with acid in a pretreatment for the bonderizing, disadvantageously leading to a large quantity of waste solution. Further, the cold-forged workpiece is hardened, and must be annealed after the cold forging. The zinc phosphate coating film separates from the surface of the workpiece at this time, and hence the workpiece must be bonderized again after the annealing.

In order to solve these problems in cold forging, warm or hot forging is widely employed. Flow stress of the workpiece can be reduced by increasing its temperature (to at least 500° C. in forging of a ferrous material, for example), thereby reducing a mechanical stress load on the mold. Further, the workpiece does not need to be annealed/bonderized after forging.

In the warm or hot forging process, however, no reliable lubrication method can substitute for bonderizing. Although a method using a solid lubricant of graphite or boric acid is employed, sufficient lubricity is not attained, so that the surface of the mold is remarkably worn in this method. Thus, a mold which is hardly worn in cold, warm or hot forging is needed.

SUMMARY OF THE INVENTION

Accordingly, the present invention has been proposed in order to solve the aforementioned problems.

An object of the present invention is to provide a coated tool having a hardly worn coating film.

Another object of the present invention is to provide a coated cutting tool having a hardly worn coating film, which causes no problem of deposition chipping or increase of effusion resistance of swarfs.

Still another object of the present invention is to provide a coated mold having a coating film which is hardly worn in cold, warm or hot forging.

A further object of the present invention is to provide a coated cutting tool which can improve its deposition resistance for preventing its surface from accumulating deposits of a workpiece material while making the best use of excellent properties of titanium ceramics and a method of manufacturing the same.

A coated tool according to the present invention comprises a base material and a wear-resistant coating film formed on the base material. The composition of the wear-resistant coating film is expressed as $(Ti_xAl_yV_z)(C_uN_v$, $O_w$), where x, y, z, u, v and w represent the atomic ratios of Ti, Al, V, C, N and O respectively. Relations $x+y+z=1$, $u+v+w=1$, $0.2<x<1$, $0\leq y<0.8$, $0.02\leq z<0.6$, $0\leq u<0.7$, $0.3<v\leq 1$ and $0\leq w<0.5$ hold between the atomic ratios x, y, z, u, v and w. The thickness of the wear-resistant coating film is at least 0.5 μm and not more than 15 μm.

The hardness of the inventive coated tool having the aforementioned structure is increased since the wear-resistant coating film is made of titanium ceramics. Further, the wear-resistant coating film, the component or components of a workpiece material and oxygen contained in the atmosphere react with each other, to form a composite oxide whose melting point is at a temperature of not more than 1000° C. on the surface of the wear-resistant coating film. When the workpiece is made of an iron alloy containing chromium or nickel, vanadiate of divanadium pentaoxide ($V_2O_5$) whose melting point is at the temperature of 690° C. and an oxide of iron, chromium or nickel is formed as a composite oxide. This vanadiate may be $Fe_2O_3 \cdot V_2O_5$ whose melting point is at the temperature of 860° C., $Cr_2O_3 \cdot V_2O_5$ whose melting point is at the temperature of 850° C., or $3NiO \cdot V_2O_5$ whose melting point is at the temperature of 900° C. Formation of such a low melting point oxide is also called a vanadium attack in general, and known as a noxious phenomenon accelerating wear of an iron-based structural material in a high-temperature/high-speed combustion gas atmosphere. However, an example utilizing such a phenomenon for improving lubricity in cutting is absolutely unknown. The wear-resistant coating film is hardly worn due to the action of the low melting point oxide serving as a lubricative coating, and abrasion loss of the film is reduced. Even if the surface of the wear-resistant coating film loses the lubricative coating, the wear-resistant coating film, oxygen contained in the atmosphere and the workpiece react with each other to form a new lubricative coating on the surface of the wear-resistant coating film. In this point, the lubricative coating can be regarded as having self recoverability due to repetitive wear and reproduction or reformation. Therefore, the wear-resistant coating film still attains a lubricative effect after losing its original lubricating film, unlike to the conventional molybdenum disulfide coating. In other words, a lubricative coating is continuously formed on the surface of the wear-resistant coating film in the present invention so far as this coating film is present during working. Consequently, abrasion loss of the wear-resistant coating film can be reduced.

The atomic ratios of the elements contained in the wear-resistant coating film are limited for the following reasons:

The atomic ratio x of titanium is set as $0.2<x$, since the hardness of the wear-resistant coating film is reduced if the atomic ratio is not more than 0.2. The atomic ratio y of aluminum is set as $y<0.8$ since the crystal structure of the wear-resistant coating film changes from a face-centered cubic structure (fcc) to a hexagonal closest packing structure (hcp) and the hardness of the film is remarkably reduced if the atomic ratio y exceeds 0.8. The atomic ratio z of vanadium is set as $0.02\leq z$ since no effect is attained by addition of vanadium and no composite oxide having lubricity is sufficiently formed if the atomic ratio z is less than 0.02. Further, the atomic ratio z of vanadium is set as $z<0.6$ since the hardness of the wear-resistant coating film is reduced if the atomic ratio z exceeds 0.6. The atomic ratio u of carbon is set as $u<0.7$ since liberated carbon is mixed into the wear-resistant coating film to make the film fragile if the atomic ratio u exceeds 0.7. The atomic ratio v of nitrogen is set as $0.3<v$ since the wear-resistant coating film is made fragile if the atomic ratio v is not more than 0.3. The atomic ratio w of oxygen is set as $w<0.5$ since an instable titanium oxide is formed in the wear-resistant coating film to reduce the strength of the film if the atomic ratio w exceeds 0.5.

The thickness of the wear-resistant coating film must be at least 0.5 μm. If the thickness is less than 0.5 μm, the strength of the coating film itself is so reduced that the coating film cannot exhibit wear resistance. On the other hand, the thickness of the wear-resistant coating film must not exceed 15 μm. If the thickness exceeds 15 μm, the wear-resistant coating film is readily separated or chipped.

The wear-resistant coating film preferably includes a plurality of stacked first films. The composition of each first film is $(Ti_a, Al_b, V_c)(C_d, N_e, O_f)$, where a, b, c, d, e and f represent the atomic ratios of Ti, Al, V, C, N and O respectively. Relations $a+b+c=1$, $d+e+f=1$, $0.2<a<1$, $0\leq b<0.8$, $0\leq c<0.6$, $0\leq d<0.7$, $0.3<e\leq 1$ and $0\leq f<0.5$ hold between the atomic ratios a, b, c, d, e and f. In this case, progress of breakage of the film is effectively inhibited at a respective interface between the stacked plurality of first films, whereby wear of the wear-resistant coating film can be reduced. The atomic ratios a, b, d, e and f of the elements are limited in the constant ranges for reasons similar to those for limiting the atomic ratios x, y, u, v and w. The atomic ratio c is set to be at least 0 since a composite oxide film for serving as a lubricative coating is formed in a necessary quantity if the atomic ratio z of vanadium in the overall wear-resistant coating film is at least 0.02, and the atomic ratio c is not particularly relevant to the quantity of the formed composite oxide.

Further, the thickness of each first film is preferably at least 0.5 nm and not more than 500 nm. The thickness of each first film is set to be at least 0.5 nm since the elements forming the first film are not solidly dissolved but attain the correct atomic arrangement to improve the film quality if the thickness is in excess of 0.5 nm. On the other hand, the thickness of each first film is set to be not more than 500 nm since breakage of the wear-resistant coating film is further effectively inhibited at the respective interface between the first films due to stacking of the films.

Further, the thickness of each first film is preferably at least 0.5 nm and not more than 50 nm. The thickness of the first film is set to be not more than 50 nm since the stacked films can attain high hardness exceeding that of each film if the thickness of each first film is not more than 50 nm.

The compositions or thicknesses of the first films are preferably different from each other. Further, only the compositions or the compositions and thicknesses of the first films are preferably different from each other. In this case, the effect of preventing progress of breakage of the wear-resistant coating film at the interface between the first films is increased as compared with the case of forming the first films in substantially identical thicknesses and compositions, to reduce wear of the wear-resistant coating film.

The wear-resistant coating film preferably includes a plurality of stacked first and second films, and the second film preferably contains at least one or two components of vanadium nitride (VN), vanadium carbide (VC), vanadium carbo-nitride (V(C,N)), vanadium carbo-oxide (V(C,O)), vanadium oxy-nitride (V(N,O)) and vanadium carbo-oxy-nitride (V(C,N,O)). In this case, a layer structure can be readily formed by stacking the first film serving as an alloy layer containing vanadium and the second film serving as an independent vanadium layer with each other. The thickness of each of the first and second films is preferably at least 0.5 nm and not more than 500 nm. The thickness of the second film is set to be at least 0.5 nm and not more than 500 nm, for reasons similar to those for setting the thickness of each first film to be at least 0.5 nm and not more than 500 nm.

Further, the thickness of each of the first and second films is more preferably at least 0.5 nm and not more than 50 nm. The thickness of the second film is set to be not more than 50 nm for reasons similar to those for setting the thickness of each first film as not more than 50 nm.

The first and second films are preferably alternately stacked with each other.

The wear-resistant coating film preferably includes a plurality of stacked first and third films, the third film preferably contains either aluminum nitride (AlN) or aluminum carbo-nitride (Al(C,N)) or both of these components, and the thickness of the third film is preferably at least 0.5 nm and not more than 50 nm. In this case, a layer structure can be readily formed by stacking the first layer serving as an alloy layer containing aluminum and the third layer serving as an independent aluminum layer with each other. The thickness of the third film is set to be at least 0.5 nm since the respective components are solidly dissolved if the thickness is less than 0.5 nm and the wear-resistant coating film is not brought into a layer structure of thin films but its film quality is reduced as a result. The thickness of the third film is set to be not more than 50 nm since the hardness of the wear-resistant coating film is not increased if the thickness exceeds 50 nm.

The first and third films are preferably alternately stacked with each other.

The wear-resistant coating film preferably includes an adhesion layer consisting of TiN, and this adhesion layer is preferably in contact with the base material. In this case, the adhesion between the base material and the wear-resistant coating film is improved, so that the wear-resistant coating film is hardly separated from the base material. Consequently, the life of the coated tool is effectively improved.

The base material is preferably prepared from ceramics, cemented carbide, cermet, high-speed steel, die steel, pre-hardened steel or precipitation-hardened stainless steel.

The wear-resistant coating film preferably has a face-centered cubic structure, so that a diffraction line from a (111) plane relatively exhibits the maximum intensity among those derived from the wear-resistant coating film when the crystal structure of the wear-resistant coating film is examined by $\theta$–$2\theta$ X-ray diffraction. In this case, the wear resistance of the wear-resistant coating film is improved due to the face-centered cubic structure. Further, the crystal plane having the highest atomic density is arranged in parallel with the surface of the base material due to the orientation of the wear-resistant coating film along the (111) plane, to further improve the wear resistance.

It is preferable that, when the crystal structure of the wear-resistant coating film is examined, the diffraction pattern is formed only by diffraction lines derived from a single type face-centered cubic structure and the diffraction line from the (111) plane relatively exhibits the maximum intensity among those derived from the wear-resistant coating film having the face-centered cubic structure. In this case, the stacked first to third layers can be regarded as having substantially identical structures. This phenomenon is regarded as "strain conformity", i.e., a phenomenon by which the lattice spacings of crystal lattices of films approximately match each other when the thicknesses of two types of layers having different compositions which are stacked with each other are rendered smaller than 50 nm. When this strain conformity takes place, hexagonal aluminum nitride existing under an ordinary temperature and an ordinary pressure, for example, changes to face-centered cubic aluminum nitride as if the same is set under a superhigh pressure. Face-centered cubic aluminum nitride is remarkably higher in hardness than hexagonal aluminum nitride. If strain conformity takes place in the wear-resistant coating film, therefore, the hardness of the wear-resistant coating film is further increased.

The coated tool is preferably a coated cutting tool. In this case, the surface of the coated cutting tool reacts with oxygen contained in the atmosphere and the workpiece so that an oxide coating having a low melting point is formed on the surface of the coated cutting tool, whereby a cutting tool having a hardly worn coating film can be obtained with no problem of deposition chipping or increased effusion resistance of swarfs.

On the other hand, the coated tool is preferably a coated mold, punch and die. In this case, the surface of the coated mold reacts with oxygen contained in the atmosphere and the workpiece, so that an oxide coating having a low melting point is formed on the surface of the coated mold. It is possible to obtain a coated mold whose coating film is hardly worn in case of performing cold, warm or hot forging, due to the lubricative action of the oxide having a low melting point.

A method of manufacturing a coated tool according to the present invention is adapted to supply a film material containing at least one of Ti, Al and V onto a base material by vapor deposition or sputtering, for forming a wear-resistant coating film by reacting the film material with gas containing at least one of nitrogen, carbon and oxygen by PVD. According to this method, the wear-resistant coating film can be readily formed by preparing a target material having the same components as the film to be formed and supplying the film material to this target material by vapor deposition or the like.

For example, cathodic arc ion plating or reactive sputtering may be employed as PVD.

In each of cathodic arc ion plating and reactive sputtering, an evaporation source is mounted inside of a reaction vessel for coating. The base material is set on a base material support holder having a vertical rotation axis, which is positioned at the center of the reaction vessel. The holder is rotated, for forming a wear-resistant coating film on the surface of the base material. The evaporation source is prepared from a Ti—Al—V alloy having the same composition as the coating film. Hydrocarbon gas, nitrogen or ammonia gas and carbon dioxide gas can be employed as carbon, nitrogen and oxygen sources respectively. In case of stacking films of different compositions, two types of Ti—Al—V alloys having the same compositions as the respective films are employed as evaporation sources. The evaporation sources are arranged on opposite two surfaces in the reaction vessel. The base material is set on the base material support holder and the holder is rotated, for forming a wear-resistant coating film on the base material. In an apparatus having four surfaces capable of mounting evaporation sources, identical evaporation sources are mounted on opposite surfaces and the holder is rotated, to form a wear-resistant coating film. In any case, a prescribed stacking cycle can be attained by adjusting the film forming rate and the rotational frequency of the holder. If the thickness of each layer or the stacking cycle is relatively large (if the thickness is at least 50 nm, for example), it is also possible to form films of prescribed thicknesses through the individual evaporation sources, thereafter stopping evaporation, moving the base material and stacking the films with other through other films evaporation sources.

A coated cutting tool according to an aspect of the present invention comprises a base material consisting of cemented carbide, and a wear-resistant coating film formed on the surface of the base material. The wear-resistant coating film includes a titanium nitride film and a composite nitride film. The titanium nitride film is formed to be in contact with the surface of the base material. The composite nitride film is formed on the titanium nitride film, and contains titanium, vanadium, nitrogen and an unavoidable impurity. The outermost surface of the wear-resistant coating film is coated with a low melting point oxide, containing vanadium oxide, having a melting point of not more than 1000° C. The low melting point oxide can be prepared from vanadium oxide such as divanadium pentaoxide ($V_2O_5$).

The composite nitride film may be replaced with a composite carbo-nitride film containing titanium, vanadium, carbon, nitrogen and an unavoidable impurity.

Preferably, the wear-resistant coating film coated with the aforementioned low melting point oxide is formed on at least one of portions of the cutting tool concerning cutting, i.e., a flank rubbing against a workpiece, a rake face rubbing against swarfs, and an edge part corresponding to the boundary between these two portions.

The atomic ratio (vanadium)/{(titanium)+(vanadium)} in the composite nitride film is preferably at least 0.02 and not more than 0.6.

A method of manufacturing the coated cutting tool according to the aforementioned aspect of the present invention employs steps of forming a composite nitride film on a titanium nitride film by PVD with an evaporation source of titanium and vanadium or an alloy of titanium and vanadium and reaction gas containing at least nitrogen, and oxidizing the surface of the composite nitride film by heat treatment in an atmosphere containing oxygen or vapor for forming a low melting point oxide on the outermost surface of the composite nitride film.

If the composite nitride film is replaced with a composite carbo-nitride film containing titanium, vanadium, carbon, nitrogen and an unavoidable impurity, the method of manufacturing the aforementioned coated cutting tool employs steps of forming a composite carbo-nitride film on a titanium nitride film by PVD with an evaporation source of titanium and vanadium or an alloy of titanium vanadium and reaction gas containing at least nitrogen and hydrocarbon, and oxidizing the surface of the composite carbo-nitride film by heat treatment in an atmosphere containing oxygen or vapor for forming a low melting point oxide on the outermost surface of the composite carbo-nitride film.

In the aforementioned method, the heat treatment is preferably performed at a temperature of at least 400° C.

A coated cutting tool according to another aspect of the present invention comprises a base material consisting of cemented carbide, and a wear-resistant coating film formed on the surface of the base material. The wear-resistant coating film includes a titanium nitride film and a composite nitride film. The titanium nitride film is formed to be in contact with the surface of the base material. The composite nitride film is formed on the titanium nitride film, and contains titanium, aluminum, vanadium, nitrogen and an unavoidable impurity. The outermost surface of the wear-resistant coating film is coated with a low melting point oxide, containing vanadium oxide, having a melting point of not more than 1000° C.

The composite nitride film may be replaced with a composite carbo-nitride film containing titanium, aluminum, vanadium, carbon, nitrogen and an unavoidable impurity.

Preferably, the wear-resistant coating film coated with the aforementioned low melting point oxide is formed on at least one of portions of the cutting tool concerning cutting, i.e., a flank rubbing against a workpiece, a rake face rubbing against swarfs, and an edge part corresponding to the boundary between these two portions.

The atomic ratio (vanadium)/{(titanium)+(aluminum)+(vanadium)} in the composite nitride film is preferably at least 0.02 and not more than 0.6.

A method of manufacturing the coated cutting tool according to the aforementioned aspect of the present invention employs steps of forming a composite nitride film on a titanium nitride film by PVD with an evaporation source of titanium, aluminum and vanadium, or an alloy of a combination of at least two of titanium, aluminum and vanadium and reaction gas containing at least nitrogen, and oxidizing the surface of the composite nitride film by heat treatment in an atmosphere containing oxygen or vapor for forming a low melting point oxide on the outermost surface of the composite nitride film.

If the composite nitride film is replaced with a composite carbo-nitride film containing titanium, aluminum, vanadium, carbon, nitrogen and an unavoidable impurity, the method of manufacturing the aforementioned coated cutting tool employs steps of forming a composite carbo-nitride film on a titanium nitride film by PVD with an evaporation source of titanium, aluminum and vanadium, or an alloy of a combination of at least two of titanium, aluminum and vanadium and reaction gas containing at least nitrogen and hydrocarbon, and oxidizing the surface of the composite carbo-nitride film by heat treatment in an atmosphere containing oxygen or vapor for forming a low melting point oxide on the outermost surface of the composite carbo-nitride film.

In the aforementioned method, the heat treatment is preferably performed at a temperature of at least 400° C.

The PVD employed in the method of manufacturing the coated cutting tool according to the present invention is cathodic arc ion plating, reactive sputtering or the like.

The present invention related to the aforementioned coated cutting tool and the method of manufacturing the same has been proposed on the basis of the following points recognized by the inventors:

In relation to a cutting tip, it is assumed that the temperature of a portion coming into contact with a workpiece or swarfs is so remarkably increased that oxidative reaction takes place between oxygen contained in the atmosphere or moisture in a cutting fluid material employed during cutting and components of a wear-resistant coating film in addition to simple rubbing wear, to cause the so-called oxidation wear (regarded as a phenomenon whereby the wear-resistant coating film is deteriorated by oxidation and this portion is separated).

Further, it has been generally observed that a phenomenon occurs whereby the workpiece material is deposited on a part of the cutting tool to form a so-called built-up edge. This phenomenon is caused since the workpiece, which is softened under the temperature during cutting, comes into contact with and adheres to a portion close to the insert of the tool and is there solidified again. This phenomenon disadvantageously causes chipping of the insert particularly in intermittent cutting or in case of working a number of workpieces with a single insert.

In order to solve such problems of the conventional coated cutting tool, a titanium ceramics coating of titanium nitride (TiN) or titanium carbide (TiC), a layer coating of such titanium ceramics and alumina ceramics, or a titanium aluminum nitride ((Ti,Al)N) coating is widely employed. However, every coating is merely adapted to improve the oxidation resistance and wear resistance of the coating film, and cannot solve the problems in view of prevention of deposition.

The inventors have studied coated films capable of making the best use of various characteristics of various types of ceramics, to discover that deposition in cutting can be eliminated if at least one of portions of a cutting tool concerning cutting, i.e., a flank rubbing against a workpiece, a flank rubbing against swarfs and an edge part corresponding to the boundary between these portions is coated with an oxide having a melting point of not more than 1000° C.

They have also discovered that a compound forming the coating film is preferably prepared from (Ti,V)(C,N) or (Ti,Al,V)(C,N).

They have further discovered that PVD such as cathodic arc ion plating or reactive sputtering with an evaporation source consisting of an alloy containing all of titanium (Ti), aluminum (Al) and vanadium (V) or evaporation sources consisting of the respective single metal components is preferably employed as a coating method, in order to control the composition of the compound forming the coating film.

They have further discovered that a method of heat treating the coated cutting tool provided with the aforementioned coating film in an atmosphere containing oxygen or vapor is preferable as a method of depositing a low melting point oxide having a melting point of not more than 1000° C. on the surface of the aforementioned coating film.

The first feature of the present invention resides in that the wear-resistant coating film is coated with an oxide having a low melting point. When the wear-resistant coating film is coated with such an oxide having a low melting point, the oxide is softened or melted by friction heat in cutting so that a deposited part of the workpiece readily falls off and thus does not cause deposition.

The surface of a carbo-nitride of titanium or a composite carbo-nitride of titanium and aluminum which has been generally applied to a wear-resistant coating film for a cutting tool is oxidized during cutting, to form an oxide of titanium or aluminum. In particular, alumina (chemical formula: $Al_2O_3$) which is an oxide of aluminum has high temperature hardness and excellent stability, and exhibits excellent performance in relation to a recent high cutting speed or working of a hard workpiece.

However, it has been proved that such an oxide film has no effect of suppressive deposition of the workpiece material during cutting, due to the high temperature hardness. Namely, high adhesion force between the deposit and the wear-resistant coating film causes growth of a built-up edge, to result in a phenomenon such as remarkable chipping of the forward end portion of the insert.

The inventors have also studied the relation between the oxide film formed on the surface of the wear-resistant coating film and the deposition in detail, to reach the conclusion that the deposited part of the workpiece readily falls off before growth of a built-up edge and small chipping of the forward end of the insert can be eliminated if the outermost surface of the oxide film is coated with an oxide having a low melting point.

The inventors have confirmed by measurement that the surface temperature of an insert locally exceeds 1000° C. during cutting, and hence an oxide having a low melting point of not more than 1000° C. is suitable as the aforementioned low melting point oxide. Further, the material before oxidation preferably has high hardness, in consideration of wear resistance. The inventors have experimentally prepared and studied various metals, metal nitrides and metal carbides, to discover that vanadium is most preferable as the substance satisfying the aforementioned conditions.

A carbide and a nitride of vanadium are hard substances having Vickers hardness of 2900 $kg/mm^2$ and 1500 $kg/mm^2$ respectively. Further, divanadium pentaoxide (chemical formula: $V_2O_5$) which is an oxide of vanadium is a specific substance having a low melting point of 680° C. In addition, a composite oxide (vanadate) of vanadium and iron or the like also has a low melting point of not more than 1000° C. For example, the melting points of $Fe_2O_3 \cdot V_2O_5$, $Cr_2O_3 \cdot V_2O_5$ and $3NiO \cdot V_2O_5$ are about 860° C., 850° C. and 900° C. respectively. On the other hand, titania ($TiO_2$) and alumina ($Al_2O_3$) which are oxides of titanium and aluminum have extremely high melting points of 1850° C. and 2050° C. respectively.

If a carbide or nitride of vanadium is applied to a surface coating film of a coated cutting tool as such, however, the material cost is increased and the cutting performance of the cutting tool itself is inferior in wear resistance, adhesion and the like as compared with the conventional titanium ceramics film.

Thus, a nitride of vanadium can be added to a well-known TiN ceramics film, Ti(C,N) ceramics film or (Ti,Al)N composite nitride ceramics film, for making the best use of excellent characteristics of these components.

According to the present invention, Ti(C,N) and AlN provide the film with wear resistance and oxidation resistance respectively while V serves as the material for forming vanadium oxide having self recoverability, to attain compatibility of wear resistance and chipping resistance.

The amount of vanadium added to the (Ti,V)(C,N) or (Ti,Al,V)(C,N) film can be optimized by the atomic ratio of vanadium in the total composition of the metal component (Ti,V) or (Ti,Al,V). The optimum value of {V/(Ti+V)} or {V/(Ti+Al+V)} is at least 0.02 and not more than 0.6 (at least 2% and not more than 60%). If the atomic ratio is not more than 2%, only a small amount of vanadium oxide is formed so that an effect of preventing deposition cannot be attained when an oxide is formed on the surface by a method described later. If the atomic ratio exceeds 60%, the characteristics of the TiN, Ti(C,N) or (Ti,Al)N film forming the base are deteriorated to attain an opposite effect.

In order to implement control of the aforementioned composition or structure, it is necessary to employ PVD utilizing an evaporation source consisting of an alloy containing all of Ti, Al and V or the respective single metal components as the method of forming the wear-resistant coating film. In particular, cathodic arc ion plating or reactive sputtering is preferably employed as the PVD. CVD (chemical vapor deposition) is unpreferable since it is impossible to form a substance such as (Ti,Al,V)(C,N) which is in nonequilibrium in chemical reaction in this case.

In each of cathodic arc ion plating and reactive sputtering, a film consisting of the material according to the present invention can be formed on the surface of the tool with a uniform thickness by mounting the evaporation source on a side, top or bottom surface of a vacuum vessel of a coating apparatus, setting the base material on a base material support holder in the vacuum vessel and causing motion such as rotation of the holder.

While a Ti—Al—V alloy of an arbitrary composition may be extremely high-priced due to difficulty in preparation or the like in general, an evaporation source employing a commercially available Ti-6Al-4V alloy is employable and can be purchased at a relatively low cost. If evaporation sources consisting of the respective single metal components are employed, it is possible to avoid difficulty of forming an alloy.

As the method of depositing the low melting point oxide having a melting point of not more than 1000° C. on the surface of the wear-resistant coating film, heat treatment may be performed on the coated cutting tool provided with the wear-resistant coating film containing vanadium in an atmosphere containing oxygen or vapor at a temperature of at least 400° C. While oxidative reaction takes place also at a temperature of not more than 400° C., an extremely long time is unpreferably required for forming the low melting point oxide film in a thickness capable of attaining a prescribed effect in this case.

The film formed to be in contact with the base material is preferably prepared from TiN. When the (Ti,Al,V)N or ((Ti,AlV)C,N) film is formed on the base material with interposition of such a TiN film, higher adhesion hardness is attained as compared with the case of directly forming the film on the base material.

According to this aspect of the present invention, as hereinabove described, it is possible to prevent deposition of the workpiece on a portion of the cutting tool concerning cutting such as a flank or a rake face, inhibit progress wear of the cutting tool, and make the best use of the wear resistance of the coating film. The present invention is usefully applicable to cutting tools for perforation, end milling, milling and turning.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

EXAMPLE 1

Figure 1:
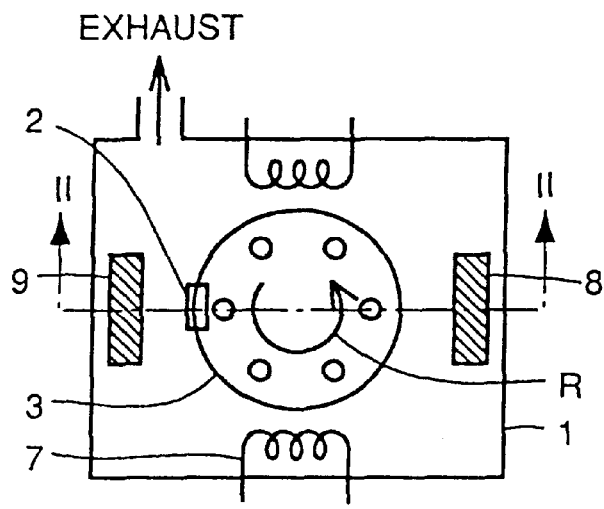
FIG. 1 is a top plan view conceptually showing a coating film preparing apparatus employed in Example 1.
Figure 2:
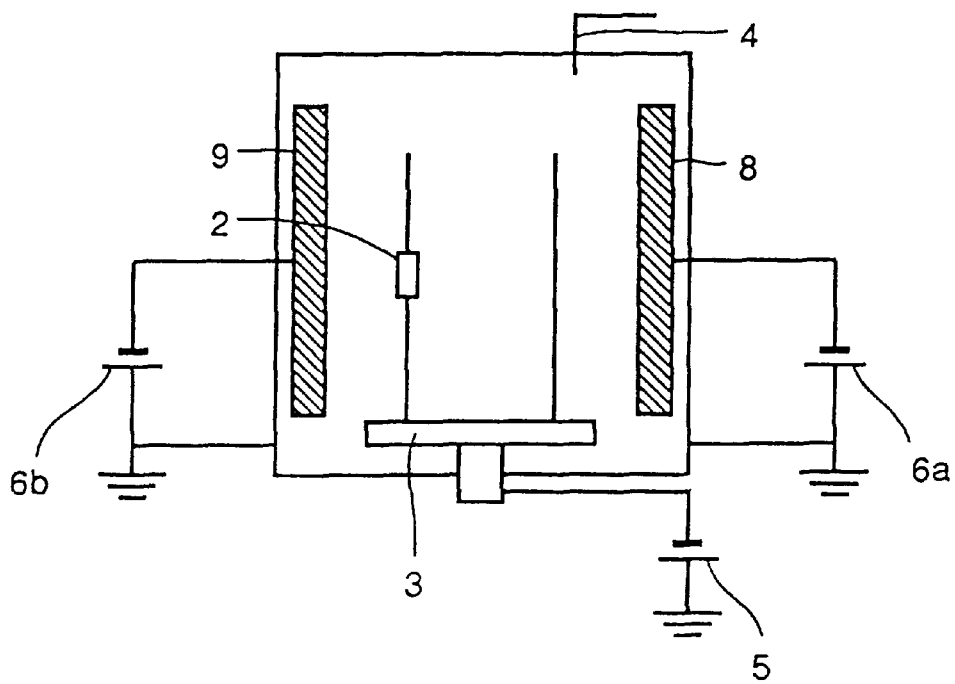
FIG. 2 conceptually illustrates a section taken along the line II—II in FIG. 1.

Referring to FIGS. 1 and 2, a coating film preparing apparatus comprises a reaction vessel 1, a base material support 3, a material gas supply nozzle 4, dc power sources 5, 6a and 6b, a heater 7 and metal evaporation sources 8 and 9.

The reaction vessel 1 is connected with a vacuum pump, so that its internal pressure is changeable. The base material support 3, the material gas supply nozzle 4, the heater 7 and the metal evaporation sources 8 and 9 are provided in this reaction vessel 1. The base material support 3 is rotatable along arrow R. This base material support 3 is electrically connected with the dc power source 5. The positive electrode of the dc power source 5 is grounded, while the negative electrode is connected with the base material support 3. The metal evaporation source 8 is electrically connected with the dc power source 6a. The positive electrode of the dc power source 6a is grounded and connected to the reaction vessel 1. The negative electrode of this dc power source 6a is connected to the metal evaporation source 8. The metal evaporation source 9 is electrically connected with the negative electrode of the dc power source 6b. The metal evaporation sources 8 and 9 are arranged to face each other across the base material support 3.

In this apparatus, a base material 2 cleaned with a cleaning solution such as an organic solvent was first fixed to the base material support 3. Metal titanium was set on the metal evaporation source 8. An alloy containing Ti, Al and V in desired ratios was set on the metal evaporation source 9.

The internal pressure of the reaction vessel 1 was adjusted to below $1 \times 10^{-3}$ Pa by the vacuum pump. Argon gas was fed from the material gas supply nozzle 4, and the base material 2 was heated with the heater 7. When the base material 2 was prepared from high-speed steel, its temperature was increased 300 to 450° C. When the base material 2 was prepared from cemented carbide, cermet or ceramics, on the other hand, its temperature was increased 400 to 600° C. The flow rate of argon gas was so adjusted that the internal pressure of the reaction vessel 1 was 2.7 Pa (20 mTorr) when the temperature of the base material 2 reached the prescribed level. The potentials of the base material support 3 and the base material 2 were adjusted to −1000 V by the dc power source 5, and argon plasma was generated in the reaction vessel 1 for plasma-cleaning the surface of the base material 2. Slight soil was removed from the surface of the base material 2 by this operation.

Then, the flow rate of argon gas was so adjusted that the pressure in the reaction vessel 1 was 0.7 Pa (5 mTorr). Power of −30 V and 100 A was supplied from the dc power source 6a to the metal evaporation source 8, to generate titanium ions from the metal evaporation source 8. Thus, the titanium ions sputter-cleaned the surface of the base material 2, to completely remove heavy soil and an oxide film from the surface of the base material 2.

on the metal evaporation source 9 were adjusted to 50%, 40% and 10% respectively.

Due to the aforementioned procedure, a coated cutting tool having a wear-resistant coating film provided on a base material was prepared. Further, a scratch test was made with a diamond indenter, to evaluate adhesion strength of the wear-resistant coating film provided on the coated cutting tool. Table 1 shows the results.

TABLE 1

| Sample No. | Base Material | Presence/Absence of First TiN Layer | Coating Film Structure | Scratch Critical Load (N) | Remarks |
|---|---|---|---|---|---|
| 101 | high-speed steel | yes | $(Ti_{0.3}Al_{0.6}V_{0.1})N$ | 75 | inventive |
| 102 | cemented carbide | yes | $(Ti_{0.2}Al_{0.3}V_{0.49})N$ | 72 | inventive |
| 103 | cermet | yes | $(Ti_{0.3}Al_{0.5}V_{0.2})N$ | 75 | inventive |
| 104 | ceramics | yes | $(Ti_{0.3}Al_{0.6}V_{0.1})N$ | 78 | inventive |
| 105 | high-speed steel | no | $(Ti_{0.3}Al_{0.3}V_{0.4})(C_{0.2}N_{0.8})$ | 48 | inventive |
| 106 | cemented carbide | no | $(Ti_{0.5}Al_{0.3}V_{0.2})(C_{0.3}N_{0.6}O_{0.1})$ | 49 | inventive |
| 107 | cermet | no | $(Ti_{0.9}Al_{0.06}V_{0.04})(C_{0.3}N_{0.7})$ | 51 | inventive |
| 108 | ceramics | no | $(Ti_{0.4}Al_{0.3}V_{0.3})(C_{0.2}N_{0.6}O_{0.2})$ | 55 | inventive |

In this state, nitrogen gas was first introduced from the material gas supply nozzle 4 so that the pressure in the reaction vessel 1 was 4.0 Pa (30 mTorr) and the potential of the metal evaporation source 8 was adjusted to −200 V. Formation of a TiN film was started on the surface of the base material 2, and this state was maintained until the thickness of the TiN film reached a prescribed level.

After complete formation of the TiN film, power of −30 V and 100 A was supplied from the dc power source 6b to the metal evaporation source 9, to generate titanium, aluminum and vanadium ions from the metal evaporation source 9. These titanium, aluminum and vanadium ions reacted with nitrogen in the reaction vessel 1 to form a nitride film of an alloy consisting of Ti, Al and V in prescribed atomic ratios on the surface of the base material 2. Thus, a (Ti,Al,V)N film was obtained. The power supply to the metal evaporation source 9 was stopped after complete formation of the (Ti,Al,V)N film. Then, introduction of nitrogen gas and argon gas was stopped. Thereafter the potential of the base material support 3 was adjusted to 0 V. Heating with the heater 7 or the like was stopped. It was confirmed that the temperature of the base material 2 was reduced below 100° C., and the base material 2 was taken out from the reaction vessel 1. Thus, a wear-resistant coating film was obtained.

In a procedure substantially similar to the aforementioned formation of the (Ti,Al,V)N film, methane gas and carbon dioxide gas were introduced into the reaction vessel 1 at prescribed flow rates in addition to nitrogen gas, to form a (Ti,Al,V)(C,N,O) film.

Further, the atomic ratios of Ti, Al and V in the alloy set on the metal evaporation source 9 were changed to form a film containing Ti, Al and V in different ratios. In case of forming a $(Ti_{0.5},Al_{0.4},V_{0.1})N$ film, for example, the atomic ratios of titanium, aluminum and vanadium in the alloy set Referring to Table 1, "high-speed steel" indicates base materials of grade JIS SKH51 high-speed steel. "Cemented carbide" indicates base materials of grade JIS P30 cemented carbide. "Cermet" indicates base materials of titanium carbo-nitride cermet. "Ceramics" indicates base materials of $TiC-Al_2O_3$ ceramics. Further, "scratch critical load" indicates loads applied to the diamond indenter in separation of the wear-resistant coating films. It is understood from Table 1 that the wear-resistant coating films of samples Nos. 101 to 104 provided with TiN films are higher in adhesion than those of samples Nos. 105 to 108 provided with no TiN films.

EXAMPLE 2

Figure 3:
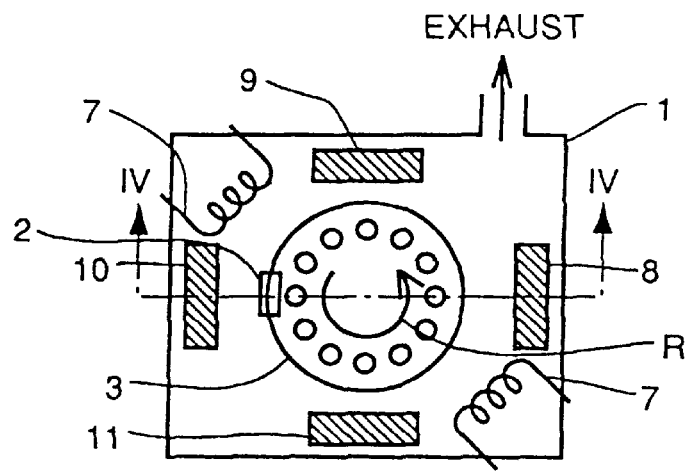
FIG. 3 is a top plan view conceptually showing a coating film preparing apparatus employed in Example 2.
Figure 4:
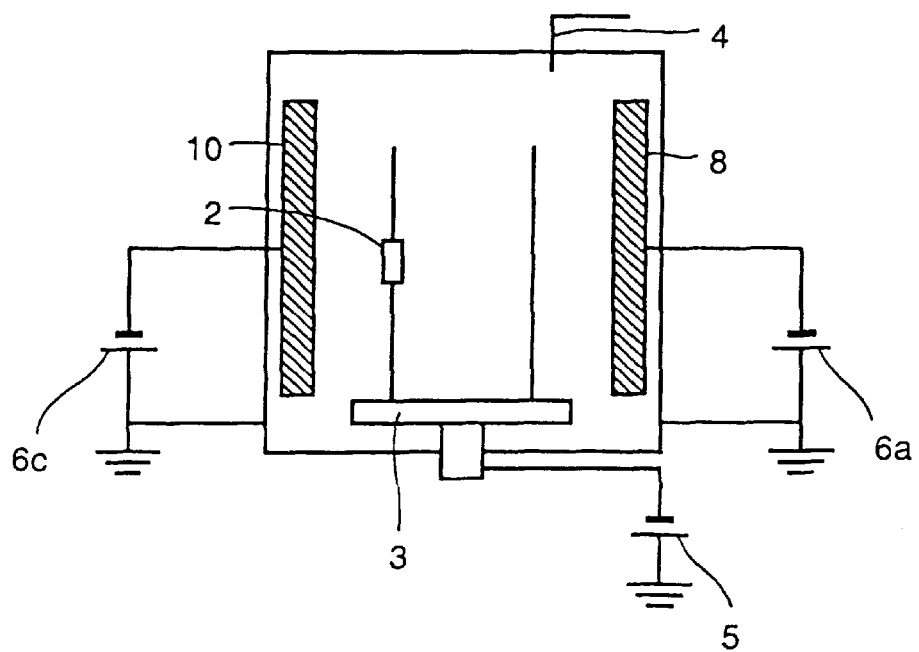
FIG. 4 conceptually illustrates a section taken along the line IV—IV in FIG. 3.

While the coating film preparing apparatus shown in FIGS. 1 and 2 has two metal evaporation sources 8 and 9, an apparatus shown in FIGS. 3 and 4 has four metal evaporation sources 8, 9, 10 and 11. Metal titanium and metal vanadium were set on the metal evaporation sources 8 and 10. Alloys consisting of Ti, Al and V in desired ratios were set on the metal evaporation sources 9 and 11. These metal evaporation sources 8 to 11 were connected to dc power sources. A heater 7 was arranged on a position different from that shown in FIGS. 1 and 2. The remaining points of the coating film preparing apparatus shown in FIGS. 3 and 4 are identical to those of the apparatus shown in FIGS. 1 and 2.

In this apparatus, a plurality of samples having different thicknesses, compositions and layer structures were formed on base materials in a similar procedure to that in Example 1, as shown in Tables 2 and 3. In case of forming first TiN layers on the base materials, films A and B having the thicknesses and compositions shown in Table 2 were successively and alternately formed on the first TiN layers to attain the overall thicknesses shown in Table 3. A scratch test was made on these samples with a diamond indenter, to evaluate adhesion strength of wear-resistant coating films. Further, Knoop hardness values (measurement load: 20 g) of the wear-resistant coating films were measured. Tables 2 and 3 show the results.

TABLE 2

| Sample No. | Base Material | Method | Presence/ Absence of First TiN Layer | Film A Film Composition Ti | Al | V | C | N | O | Thickness (nm) | Film B Film Composition Ti | Al | V | C | N | O | Thickness (nm) |
|---|---|---|---|---|---|---|---|---|---|---|---|---|---|---|---|---|---|
| 201 | high-speed steel | arc IP | yes | 0.4 | 0.6 | 0 | 0 | 1 | 0 | 1.5 | 0.6 | 0.2 | 0.2 | 0 | 1 | 0 | 1.0 |
| 202 | | | yes | 0.5 | 0.3 | 0.2 | 0.3 | 0.7 | 0 | 45 | 0.3 | 0.5 | 0.2 | 0 | 1 | 0 | 25 |
| 203 | | | yes | 0.4 | 0.3 | 0.3 | 0.3 | 0.5 | 0.2 | 350 | 0.3 | 0.4 | 0.3 | 0.3 | 0.5 | 0.2 | 200 |
| 204 | | sputtering | yes | 0.4 | 0.3 | 0.3 | 0.2 | 0.8 | 0 | 35 | 0 | 0 | 1 | 0.2 | 0.8 | 0 | 25 |
| 205 | | arc IP | yes | 0.51 | 0 | 0.49 | 0 | 1 | 0 | 25 | 0 | 1 | 0 | 0 | 1 | 0 | 10 |
| 206 | | | yes | 0.6 | 0.4 | 0 | 0.3 | 0.7 | 0 | 18 | 0 | 0 | 1 | 0.3 | 0.7 | 0 | 15.2 |
| 207 | | sputtering | yes | 0.4 | 0.5 | 0.1 | 0.2 | 0.8 | 0 | 35 | 0 | 1 | 0 | 0.2 | 0.8 | 0 | 10 |
| 208 | | | yes | 0.5 | 0.3 | 0.2 | 0.2 | 0.7 | 0.1 | 430 | 0 | 0 | 1 | 0.2 | 0.7 | 0.1 | 380 |
| 209 | cermet | arc IP | yes | 0.6 | 0.3 | 0.1 | 0 | 1 | 0 | 2.6 | 0 | 0 | 1 | 0 | 1 | 0 | 3 |
| 210 | | | yes | 0.9 | 0.06 | 0.04 | 0.3 | 0.7 | 0 | 25.6 | 0 | 0 | 1 | 0.3 | 0.7 | 0 | 28 |
| 211 | | sputtering | yes | 0.3 | 0.2 | 0.5 | 0.2 | 0.8 | 0 | 8.5 | 0 | 1 | 0 | 0 | 1 | 0 | 2.5 |
| 212 | | | yes | 0.5 | 0.3 | 0.2 | 0.2 | 0.7 | 0.1 | 39 | 0 | 0 | 1 | 0.2 | 0.7 | 0.1 | 34 |
| 213 | ceramics | arc IP | yes | 0.6 | 0.3 | 0.1 | 0 | 1 | 0 | 3.6 | 0 | 0 | 1 | 0 | 1 | 0 | 3.1 |
| 214 | | | yes | 0.6 | 0.1 | 0.3 | 0.3 | 0.7 | 0 | 45 | 0 | 1 | 0 | 0.3 | 0.7 | 0 | 33 |
| 215 | | | yes | 0.5 | 0.3 | 0.2 | 0.2 | 0.7 | 0.1 | 460 | 0 | 0 | 1 | 0.2 | 0.7 | 0.1 | 430 |
| 216 | | sputtering | yes | 0.4 | 0.3 | 0.3 | 0.2 | 0.8 | 0 | 6.2 | 0 | 1 | 0 | 0 | 1 | 0 | 3.5 |
| 217 | high-speed steel | arc IP | no | 0.5 | 0.3 | 0.2 | 0.3 | 0.7 | 0 | 2.5 | 0 | 1 | 0 | 0 | 1 | 0 | 2.7 |
| 218 | cemented carbide | | no | 0.32 | 0.3 | 0.38 | 0 | 1 | 0 | 256 | 0 | 0 | 1 | 0 | 1 | 0 | 75 |
| 219 | cermet | | no | 0.9 | 0.06 | 0.04 | 0.3 | 0.7 | 0 | 35 | 0 | 0 | 1 | 0.3 | 0.7 | 0 | 27 |
| 220 | ceramics | | no | 0.6 | 0.3 | 0.1 | 0 | 1 | 0 | 13.5 | 0 | 0 | 1 | 0 | 1 | 0 | 14.8 |
| 221 | high-speed steel | | yes | 0.3 | 0.6 | 0.1 | 0 | 1 | 0 | 600 | 0 | 1 | 0 | 0 | 1 | 0 | 45 |
| 222 | cemented carbide | | yes | 0.5 | 0.3 | 0.2 | 0.3 | 0.5 | 0.2 | 0.3 | 0 | 0 | 1 | 0.3 | 0.5 | 0.2 | 0.4 |
| 223 | cermet | | yes | 0.88 | 0.1 | 0.02 | 0 | 1 | 0 | 650 | 0 | 0 | 1 | 0 | 1 | 0 | 700 |
| 224 | ceramics | | yes | 0.5 | 0.3 | 0.2 | 0.3 | 0.7 | 0 | 0.4 | 0 | 0 | 1 | 0.3 | 0.7 | 0 | 0.3 |
| 225 | high-speed steel | sputtering | yes | 0.9 | 0 | 0.1 | 0 | 1 | 0 | 540 | 0 | 1 | 0 | 0 | 1 | 0 | 570 |
| 226 | cemented carbide | | yes | 0.5 | 0.3 | 0.2 | 0.3 | 0.6 | 0.1 | 0.3 | 0 | 0 | 1 | 0.3 | 0.6 | 0.1 | 0.4 |
| 227 | cermet | | yes | 0.3 | 0.5 | 0.25 | 0 | 1 | 0 | 580 | 0 | 1 | 0 | 0 | 1 | 0 | 61 |
| 228 | ceramics | | yes | 0.5 | 0.3 | 0.2 | 0.3 | 0.7 | 0 | 0.4 | 0 | 0 | 1 | 0.3 | 0.7 | 0 | 0.3 |
| 229 | cemented carbide | arc IP | yes | 0.1 | 0.85 | 0.05 | 0.3 | 0.7 | 0 | 15 | 0 | 1 | 0 | 0.3 | 0.7 | 0 | 13 |
| 230 | | | yes | 0.3 | 0 | 0.7 | 0.3 | 0.6 | 0.1 | 18 | 0 | 0 | 1 | 0.3 | 0.6 | 0.1 | 17 |
| 231 | | | yes | 0.5 | 0.3 | 0.2 | 0.75 | 0.25 | 0 | 17 | 0 | 0 | 1 | 0.75 | 0.25 | 0 | 16 |
| 232 | | | yes | 0.5 | 0.3 | 0.2 | 0 | 0.45 | 0.55 | 15 | 0 | 1 | 0 | 0 | 0.45 | 0.55 | 14 |
| 233 | | | yes | 0.5 | 0.3 | 0.2 | 0 | 0.75 | 0.25 | 17 | 0 | 0 | 1 | 0 | 0.75 | 0.25 | 17 |
| 234 | | | yes | 0.5 | 0.3 | 0.2 | 0.4 | 0.6 | 0 | 15 | 0 | 1 | 0 | 0.4 | 0.6 | 0 | 14 |

TABLE 3

| Sample No | Composition Ratio of Component in Overall Film Ti | Al | V | C | N | O | Total Thickness ($\mu$m) | Scratch Critical Load (N) | Film Hardness kg/mm$^2$ | Remarks |
|---|---|---|---|---|---|---|---|---|---|---|
| 201 | 0.48 | 0.44 | 0.08 | 0 | 1 | 0 | 0.6 | 75 | 4020 | inventive |
| 202 | 0.43 | 0.37 | 0.2 | 0.19 | 0.81 | 0 | 2.5 | 77 | 3680 | inventive |
| 203 | 0.36 | 0.34 | 0.3 | 0.3 | 0.5 | 0.2 | 12.5 | 85 | 3020 | inventive |
| 204 | 0.23 | 0.18 | 0.59 | 0.2 | 0.8 | 0 | 8.0 | 71 | 3450 | inventive |
| 205 | 0.36 | 0.29 | 0.35 | 0 | 1 | 0 | 2.0 | 72 | 3600 | inventive |
| 206 | 0.33 | 0.22 | 0.46 | 0.3 | 0.7 | 0 | 4.5 | 76 | 3640 | inventive |
| 207 | 0.31 | 0.61 | 0.08 | 0.2 | 0.8 | 0 | 7.0 | 69 | 3400 | inventive |
| 208 | 0.27 | 0.16 | 0.58 | 0.2 | 0.7 | 0.1 | 14.2 | 76 | 3250 | inventive |
| 209 | 0.28 | 0.14 | 0.58 | 0 | 1 | 0 | 0.7 | 75 | 4140 | inventive |
| 210 | 0.43 | 0.03 | 0.54 | 0.3 | 0.7 | 0 | 4.0 | 73 | 3740 | inventive |
| 211 | 0.23 | 0.38 | 0.39 | 0.15 | 0.85 | 0 | 7.5 | 68 | 3850 | inventive |
| 212 | 0.27 | 0.16 | 0.57 | 0.2 | 0.7 | 0.1 | 9.1 | 75 | 3420 | inventive |
| 213 | 0.32 | 0.16 | 0.52 | 0 | 1 | 0 | 3.0 | 78 | 4230 | inventive |
| 214 | 0.35 | 0.48 | 0.17 | 0.3 | 0.7 | 0 | 4.0 | 81 | 3750 | inventive |
| 215 | 0.26 | 0.16 | 0.59 | 0.2 | 0.7 | 0.1 | 9.5 | 82 | 3120 | inventive |
| 216 | 0.26 | 0.55 | 0.19 | 0.13 | 0.87 | 0 | 6.5 | 72 | 4210 | inventive |
| 217 | 0.24 | 0.66 | 0.1 | 0.14 | 0.86 | 0 | 4.0 | 36 | 4120 | inventive |
| 218 | 0.25 | 0.23 | 0.52 | 0 | 1 | 0 | 3.0 | 38 | 3010 | inventive |
| 219 | 0.51 | 0.03 | 0.46 | 0.3 | 0.7 | 0 | 5.0 | 35 | 3720 | inventive |
| 220 | 0.29 | 0.14 | 0.57 | 0 | 1 | 0 | 4.0 | 41 | 3420 | inventive |

TABLE 3-continued

| Sample No | Composition Ratio of Component in Overall Film | | | | | | Total Thickness ($\mu$m) | Scratch Critical Load (N) | Film Hardness kg/mm$^2$ | Remarks |
|---|---|---|---|---|---|---|---|---|---|---|
| | Ti | Al | V | C | N | O | | | | |
| 221 | 0.28 | 0.63 | 0.09 | 0 | 1 | 0 | 6.0 | 52 | 3420 | inventive |
| 222 | 0.21 | 0.13 | 0.66 | 0.3 | 0.5 | 0.2 | 3.5 | 48 | 2400 | inventive |
| 223 | 0.42 | 0.05 | 0.53 | 0 | 1 | 0 | 4.0 | 49 | 1950 | inventive |
| 224 | 0.29 | 0.17 | 0.54 | 0.3 | 0.7 | 0 | 5.0 | 51 | 2310 | inventive |
| 225 | 0.44 | 0.51 | 0.05 | 0 | 1 | 0 | 6.2 | 53 | 1900 | inventive |
| 226 | 0.21 | 0.13 | 0.66 | 0.3 | 0.6 | 0.1 | 3.7 | 55 | 2200 | inventive |
| 227 | 0.27 | 0.55 | 0.23 | 0 | 1 | 0 | 4.1 | 54 | 1850 | inventive |
| 228 | 0.29 | 0.17 | 0.54 | 0.3 | 0.7 | 0 | 4.9 | 48 | 2300 | inventive |
| 229 | 0.05 | 0.92 | 0.03 | 0.3 | 0.7 | 0 | 4.3 | 44 | 1720 | comparative |
| 230 | 0.15 | 0 | 0.85 | 0.3 | 0.6 | 0.1 | 4.5 | 49 | 1610 | comparative |
| 231 | 0.26 | 0.15 | 0.59 | 0.75 | 0.25 | 0 | 4.4 | 51 | 1350 | comparative |
| 232 | 0.26 | 0.64 | 0.1 | 0 | 0.45 | 0.55 | 4.7 | 38 | 1120 | comparative |
| 233 | 0.25 | 0.15 | 0.6 | 0 | 0.75 | 0.25 | 15.4 | 51 | 1350 | comparative |
| 234 | 0.26 | 0.64 | 0.1 | 0.4 | 0.6 | 0 | 0.4 | 38 | 1120 | comparative |

Referring to Table 2, "arc IP" indicates wear-resistant coating films prepared by cathodic ion plating. "Sputtering" indicates wear-resistant coating films prepared by sputtering. "Film composition" indicates atomic ratios of components contained in the films. Referring to Table 3, "composition ratio of component in overall film" indicates the atomic ratios of the respective components in the overall films.

It is understood from Tables 2 and 3 that the inventive samples Nos. 201 to 216 provided with TiN layers exhibited larger scratch critical loads and higher adhesion as compared with the samples Nos. 217 to 228 provided with no TiN films. The samples Nos. 229 to 234 exhibited low scratch critical loads since the atomic ratios of the components forming the films or the overall thicknesses were out of the inventive ranges.

The coating films of the samples Nos. 201, 202, 204 to 207, 209 to 214, 216, 217 and 219 to 221 exhibited particularly high hardness. This is conceivably because the so-called strain conformity took place due to reduction of the film thicknesses.

Thus, it is understood that the wear-resistant coating films of the inventive samples are higher in adhesion and hardness than those of the comparative samples.

EXAMPLE 3

End mills having coating films of various compositions were prepared in the procedure of Example 1. The base materials of the end mills were prepared from JIS P30 cemented carbide. The structures of these coating films were examined by $\theta$–2$\theta$ X-ray diffraction. Further, these end mills were subjected to a cutting performance test under the following cutting conditions:

End Mill: $\phi$6 mm, two edges, JIS P30 cemented carbide
Workpiece: titanium alloy (Ti-6Al-4V)
Cutting Method: lateral down cutting
Cutting Speed: 80 m/min.
Feed Rate: 0.03 mm/edge
Feed: Rd 1 mm×Ad 7 mm
Condition: dry air blow
Evaluation: outer peripheral flank wear width at a cut length of 20 m Tables 4 and 5 show the results. Referring to Table 4, "maximum intensity plane in X-ray diffraction" indicates planes relatively exhibiting maximum intensity among diffraction lines derived from the wear-resistant coating films examined by $\theta$–2$\theta$ X-ray diffraction.

TABLE 4

| Composition No. | Presence/Absence of First TiN Layer | Coating Film Structure | Total Thickness ($\mu$m) | Maximum Intensity Plane in X-Ray Diffraction |
|---|---|---|---|---|
| [1] | yes | $(Ti_{0.22}Al_{0.3}V_{0.48})N$ | 0.6 | (111) |
| [2] | yes | $(Ti_{0.5}Al_{0.3}V_{0.2})(C_{0.3}N_{0.7})$ | 3.2 | (111) |
| [3] | yes | $(Ti_{0.4}Al_{0.5}V_{0.1})(C_{0.2}N_{0.6}O_{0.2})$ | 14.3 | (111) |
| [4] | yes | $(Ti_{0.3}Al_{0.5}V_{0.2})N$ | 7.5 | (111) |
| [5] | yes | $(Ti_{0.96}V_{0.04})(C_{0.3}N_{0.4}O_{0.3})$ | 6.8 | (111) |
| [6] | yes | $(Ti_{0.3}Al_{0.2}V_{0.5})(C_{0.3}N_{0.4}O_{0.3})$ | 8.1 | (111) |
| [7] | yes | $(Ti_{0.4}Al_{0.5}V_{0.1})(C_{0.2}N_{0.5}O_{0.3})$ | 6.9 | (111) |
| [8] | no | $(Ti_{0.5}Al_{0.3}V_{0.2})(C_{0.3}N_{0.7})$ | 4.2 | (111) |
| [9] | no | $(Ti_{0.4}Al_{0.3}V_{0.3})(C_{0.2}N_{0.5}O_{0.3})$ | 6.7 | (111) |
| [10] | yes | $(Ti_{0.9}Al_{0.06}V_{0.04})(C_{0.3}N_{0.4}O_{0.3})$ | 6.8 | (110) |
| [11] | yes | $(Ti_{0.3}Al_{0.2}V_{0.5})(C_{0.2}N_{0.8})$ | 8.1 | (311) |
| [12] | yes | $(Ti_{0.4}Al_{0.5}V_{0.1})(C_{0.2}N_{0.5}O_{0.3})$ | 6.9 | (100) |
| [13] | yes | $(Ti_{0.15}Al_{0.85})(C_{0.3}N_{0.7})$ | 3.5 | (111) |
| [14] | yes | $(Ti_{0.18}Al_{0.17}V_{0.65})(C_{03}N_{0.7})$ | 3.6 | (111) |
| [15] | yes | $(Ti_{0.5}Al_{0.49}V_{0.01})(C_{0.3}N_{0.7})$ | 4 | (111) |
| [16] | yes | $(Ti_{0.25}Al_{0.05}V_{0.7})(C_{0.4}N_{0.6})$ | 7.1 | (111) |
| [17] | yes | $(Ti_{0.18}Al_{0.17}V_{0.65})(C_{0.4}N_{0.6})$ | 3.6 | (111) |
| [18] | yes | $(Ti_{0.5}Al_{0.49}V_{0.01})(C_{0.75}N_{0.25})$ | 4 | (111) |

TABLE 4-continued

| Composition No. | Presence/Absence of First TiN Layer | Coating Film Structure | Total Thickness ($\mu$m) | Maximum Intensity Plane in X-Ray Diffraction |
|---|---|---|---|---|
| [19] | yes | $(Ti_{0.4}Al_{0.5}V_{0.1})(C_{0.2}N_{0.8})$ | 15.5 | (111) |
| [20] | yes | $(Ti_{0.4}Al_{0.5}V_{0.1})(C_{0.2}N_{0.8})$ | 0.4 | (111) |

TABLE 5

| Sample No. | Base Material | Composition No. | Flank Wear Width (mm) | Remarks |
|---|---|---|---|---|
| 301 | cemented | [1] | 0.19 | inventive |
| 302 | carbide | [2] | 0.13 | inventive |
| 303 | | [3] | 0.2 | inventive |
| 304 | | [4] | 0.14 | inventive |
| 305 | | [5] | 0.18 | inventive |
| 306 | | [6] | 0.16 | inventive |
| 307 | | [7] | 0.18 | inventive |
| 308 | | [8] | 0.35 | inventive |
| 309 | | [9] | 0.29 | inventive |
| 310 | | [10] | 0.29 | inventive |
| 311 | | [11] | 0.27 | inventive |
| 312 | | [12] | 0.25 | inventive |
| 313 | | [13] | 0.68 | comparative |
| 314 | | [14] | 0.65 | comparative |
| 315 | | [15] | 0.75 | comparative |
| 316 | | [16] | 0.72 | comparative |
| 317 | | [17] | 0.65 | comparative |
| 318 | | [18] | 0.75 | comparative |
| 319 | | [19] | 0.85 | comparative |
| 320 | | [20] | 0.54 | comparative |

It is understood from Tables 4 and 5 that the inventive samples Nos. 308 and 309 not provided with TiN films serving as adhesion layers and the inventive samples Nos. 310 to 312 not oriented along (111) planes exhibited somewhat large flank wear widths since the films were readily separated or had low hardness. It is also understood that the samples Nos. 313 to 318 having compositions of components which were out of the inventive ranges and the samples Nos. 319 and 320 having film thicknesses which were out of the inventive range exhibited extremely large flank wear widths. Further, worn states of inserts were observed in detail in all samples. Consequently, it has been recognized that small chipping was accumulated on the forward end portions of the inserts to result in large flank wear widths in the samples Nos. 313 to 320 due to growth and falling off of built-up edges after cutting readily deposited titanium alloys.

EXAMPLE 4

Wear-resistant coating films of various compositions were formed in a procedure similar to Example 2, to prepare drills. The base materials for the drills were prepared from JIS SKH51 high-speed steel. These drills were subjected to a cutting performance test in perforation work under the following cutting conditions:

Drill: $\phi$10 mm, SKH51 high-speed steel
Workpiece: SS41
Cutting Speed: 30 m/min.
Feed Rate: 0.15 mm/rev.
Cut Length: 30 mm (through hole)
Cutting Oil: dry type
Determination of Life: number of worked holes whose diameters exceeded a reference value (10±0.05 mm)

Tables 6 to 8 show the compositions, thicknesses, structures and test results of the wear-resistant coating films.

TABLE 6

| | Presence/ Absence of First TiN Layer | Thin Film Layer Structure Coating Film Structure | | | | | | | | | | | | | |
|---|---|---|---|---|---|---|---|---|---|---|---|---|---|---|---|
| | | Film A | | | | | | | Film B | | | | | | |
| Composition No. | | Film Composition | | | | | | Thickness (nm) | Film Composition | | | | | | Thickness (nm) |
| | | Ti | Al | V | C | N | O | | Ti | Al | V | C | N | O | |
| [21] | yes | 0.25 | 0.75 | 0 | 0 | 1 | 0 | 1.5 | 0.7 | 0 | 0.3 | 0 | 1 | 0 | 1.2 |
| [22] | yes | 0.22 | 0.58 | 0.2 | 0.3 | 0.7 | 0 | 7.5 | 0.6 | 0.2 | 0.2 | 0.3 | 0.7 | 0 | 8.0 |
| [23] | yes | 0.44 | 0.26 | 0.3 | 0.3 | 0.5 | 0.2 | 41.0 | 0.24 | 0.56 | 0.2 | 0.3 | 0.5 | 0.2 | 39.0 |
| [24] | yes | 0.35 | 0.25 | 0.4 | 0.2 | 0.8 | 0 | 5.5 | 0 | 0 | 1 | 0.2 | 0.8 | 0 | 2.5 |
| [25] | yes | 0.5 | 0.3 | 0.2 | 0.2 | 0.7 | 0.1 | 38.0 | 0 | 0 | 1 | 0.2 | 0.7 | 0.1 | 12.0 |
| [26] | yes | 0.58 | 0.12 | 0.3 | 0 | 1 | 0 | 35.0 | 0 | 1 | 0 | 0 | 1 | 0 | 31.0 |
| [27] | yes | 0.5 | 0.4 | 0.1 | 0.2 | 0.8 | 0 | 49.0 | 0 | 1 | 0 | 0.2 | 0.8 | 0 | 6.0 |
| [28] | yes | 0.5 | 0.3 | 0.2 | 0.3 | 0.7 | 0 | 12.5 | 0 | 1 | 0 | 0.3 | 0.7 | 0 | 13.0 |
| [29] | no | 0.22 | 0.58 | 0.2 | 0.3 | 0.7 | 0 | 38.0 | 0.6 | 0.2 | 0.2 | 0.3 | 0.7 | 0 | 20.0 |
| [30] | no | 0.5 | 0.3 | 0.2 | 0.2 | 0.7 | 0.1 | 380.0 | 0 | 0 | 1 | 0.2 | 0.7 | 0.1 | 120.0 |
| [31] | no | 0.4 | 0.5 | 0.1 | 0.2 | 0.8 | 0 | 210.0 | 0 | 1 | 0 | 0.2 | 0.8 | 0 | 6.0 |
| [32] | yes | 0.51 | 0.39 | 0.1 | 0 | 1 | 0 | 56.0 | 0 | 0 | 1 | 0 | 1 | 0 | 55.0 |
| [33] | yes | 0.6 | 0.4 | 0 | 0.3 | 0.7 | 0 | 180.0 | 0 | 0 | 1 | 0.3 | 0.7 | 0 | 150.0 |
| [34] | yes | 0.22 | 0.58 | 0.2 | 0.3 | 0.7 | 0 | 350.0 | 0.6 | 0.2 | 0.2 | 0.3 | 0.7 | 0 | 330.0 |
| [35] | yes | 0.5 | 0.3 | 0.2 | 0.3 | 0.5 | 0.2 | 0.6 | 0 | 0 | 1 | 0.3 | 0.5 | 0.2 | 0.4 |
| [36] | yes | 0.5 | 0.3 | 0.2 | 0.3 | 0.5 | 0.2 | 610.0 | 0 | 0 | 1 | 0.3 | 0.5 | 0.2 | 520.0 |
| [37] | yes | 0.9 | 0.06 | 0.04 | 0.3 | 0.7 | 0 | 14.3 | 0 | 0 | 1 | 0.3 | 0.7 | 0 | 17.0 |
| [38] | yes | 0.6 | 0.3 | 0.1 | 0 | 1 | 0 | 155.0 | 0 | 0 | 1 | 0 | 1 | 0 | 140.0 |
| [39] | yes | 0.4 | 0.4 | 0.2 | 0 | 1 | 0 | 28.0 | 0 | 0 | 1 | 0 | 1 | 0 | 23.0 |
| [40] | yes | 0.5 | 0.3 | 0.2 | 0.3 | 0.7 | 0 | 32.0 | 0 | 0 | 1 | 0.3 | 0.7 | 0 | 24.0 |
| [41] | yes | 0.5 | 0.4 | 0.1 | 0 | 1 | 0 | 15.0 | 0 | 0 | 1 | 0 | 1 | 0 | 16.0 |

TABLE 6-continued

| | Presence/ | Thin Film Layer Structure Coating Film Structure | | | | | | | | | | | | | |
|---|---|---|---|---|---|---|---|---|---|---|---|---|---|---|---|
| | Absence | Film A | | | | | | | Film B | | | | | | |
| Composition | of First | Film Composition | | | | | | Thickness | Film Composition | | | | | | Thickness |
| No. | TiN Layer | Ti | Al | V | C | N | O | (nm) | Ti | Al | V | C | N | O | (nm) |
| [42] | yes | 0.64 | 0.3 | 0.06 | 0.3 | 0.6 | 0.1 | 13.0 | 0 | 0 | 1 | 0.3 | 0.6 | 0.1 | 14.0 |
| [43] | yes | 0.69 | 0.3 | 0.01 | 0.3 | 0.6 | 0.1 | 13.0 | 0 | 1 | 0 | 0.3 | 0.6 | 0.1 | 14.0 |
| [44] | yes | 0.22 | 0.03 | 0.75 | 0.3 | 0.6 | 0.1 | 13.0 | 0 | 0 | 1 | 0.3 | 0.6 | 0.1 | 14.0 |
| [45] | yes | 0.13 | 0.85 | 0.02 | 0.3 | 0.6 | 0.1 | 13.0 | 0 | 1 | 0 | 0.3 | 0.6 | 0.1 | 14.0 |
| [46] | yes | 0.7 | 0.2 | 0.1 | 0 | 1 | 0 | 58.0 | 0 | 1 | 0 | 0 | 1 | 0 | 56.0 |
| [47] | yes | 0.64 | 0.3 | 0.06 | 0.8 | 0.2 | 0 | 13.0 | 0 | 0 | 1 | 0.8 | 0.2 | 0 | 14.0 |
| [48] | yes | 0.69 | 0.3 | 0.01 | 0 | 0.4 | 0.6 | 13.0 | 0 | 1 | 0 | 0 | 0.4 | 0.6 | 14.0 |
| [49] | yes | 0.44 | 0.26 | 0.3 | 0.3 | 0.5 | 0.2 | 4.1 | 0.24 | 0.56 | 0.2 | 0.3 | 0.5 | 0.2 | 3.9 |
| [50] | yes | 0.35 | 0.25 | 0.4 | 0.2 | 0.8 | 0 | 5.5 | 0 | 0 | 1 | 0.2 | 0.8 | 0 | 2.5 |
| [51] | yes | homogeneous composition film of $(Ti_{0.5}Al_{0.5})N$ | | | | | | | | | | | | | |
| [52] | yes | homogeneous composition film of $Ti(C_{0.3}N_{0.7})$ | | | | | | | | | | | | | |

TABLE 7

| Composition No. | Composition Ratio of Component in Overall Film | | | | | | Total Thickness ($\mu m$) | Type of X-Ray Diffraction Pattern | Maximum Intensity Plane in X-Ray Diffraction |
|---|---|---|---|---|---|---|---|---|---|
| | Ti | Al | V | C | N | O | | | |
| [21] | 0.45 | 0.42 | 0.13 | 0 | 1 | 0 | 0.6 | only fcc | (111) |
| [22] | 0.42 | 0.38 | 0.2 | 0.2 | 0.7 | 0 | 2.5 | only fcc | (111) |
| [23] | 0.34 | 0.41 | 0.25 | 0.3 | 0.5 | 0.2 | 14.5 | only fcc | (111) |
| [24] | 0.24 | 0.17 | 0.59 | 0.2 | 0.8 | 0 | 8.0 | only fcc | (111) |
| [25] | 0.38 | 0.23 | 0.39 | 0.2 | 0.7 | 0.1 | 8.1 | only fcc | (111) |
| [26] | 0.31 | 0.53 | 0.16 | 0 | 1 | 0 | 2.0 | only fcc | (111) |
| [27] | 0.45 | 0.46 | 0.09 | 0.2 | 0.8 | 0 | 7.0 | only fcc | (111) |
| [28] | 0.25 | 0.65 | 0.1 | 0.3 | 0.7 | 0 | 13.0 | only fcc | (111) |
| [29] | 0.35 | 0.45 | 0.2 | 0.3 | 0.7 | 0 | 2.5 | only fcc | (111) |
| [30] | 0.38 | 0.23 | 0.39 | 0.2 | 0.7 | 0.1 | 8.1 | only fcc | (111) |
| [31] | 0.39 | 0.51 | 0.1 | 0.2 | 0.8 | 0 | 7.0 | only fcc | (111) |
| [32] | 0.26 | 0.20 | 0.54 | 0 | 1 | 0 | 1.3 | only fcc | (111) |
| [33] | 0.33 | 0.22 | 0.45 | 0.3 | 0.7 | 0 | 6.8 | only fcc | (111) |
| [34] | 0.4 | 0.4 | 0.2 | 0.3 | 0.7 | 0 | 12.5 | only fcc | (111) |
| [35] | 0.3 | 0.18 | 0.52 | 0.3 | 0.5 | 0.2 | 3.5 | only fcc | (111) |
| [36] | 0.27 | 0.16 | 0.57 | 0.3 | 0.5 | 0.2 | 13.5 | only fcc | (111) |
| [37] | 0.41 | 0.03 | 0.56 | 0.3 | 0.7 | 0 | 5.0 | fcc etc. | (111) |
| [38] | 0.32 | 0.16 | 0.42 | 0 | 1 | 0 | 4.0 | fcc etc. | (111) |
| [39] | 0.22 | 0.22 | 0.56 | 0 | 1 | 0 | 4.0 | only fcc | (311) |
| [40] | 0.29 | 0.17 | 0.54 | 0.3 | 0.7 | 0 | 5.0 | only fcc | (311) |
| [41] | 0.24 | 0.19 | 0.57 | 0 | 1 | 0 | 6.2 | only fcc | (100) |
| [42] | 0.31 | 0.14 | 0.55 | 0.3 | 0.6 | 0.1 | 3.7 | onfly fcc | (110) |
| [43] | 0.33 | 0.66 | 0.01 | 0.3 | 0.6 | 0.1 | 3.7 | only fcc | (111) |
| [44] | 0.11 | 0.01 | 0.88 | 0.3 | 0.6 | 0.1 | 3.7 | only fcc | (111) |
| [45] | 0.06 | 0.93 | 0.01 | 0.3 | 0.6 | 0.1 | 3.7 | only fcc | (111) |
| [46] | 0.36 | 0.59 | 0.05 | 0 | 1 | 0 | 6.0 | fcc etc. | (111) |
| [47] | 0.31 | 0.14 | 0.55 | 0.8 | 0.2 | 0 | 3.7 | only fcc | (111) |
| [48] | 0.34 | 0.66 | 0 | 0 | 0.4 | 0.6 | 3.7 | only fcc | (111) |
| [49] | 0.34 | 0.41 | 0.25 | 0.3 | 0.5 | 0.2 | 16.1 | only fcc | (111) |
| [50] | 0.24 | 0.17 | 0.59 | 0.2 | 0.8 | 0 | 0.4 | only fcc | (111) |
| [51] | 0.5 | 0.5 | 0 | 0 | 1 | 0 | 3.7 | only fcc | (111) |
| [52] | 1 | 0 | 0 | 0.3 | 0.7 | 0 | 3.7 | only fcc | (111) |

TABLE 8

| Sample No. | Base Material | Method | Composition No. | Number of Workable Holes (Holes) | Remarks |
|---|---|---|---|---|---|
| 401 | high-speed | sputtering | [21] | 680 | inventive |
| 402 | steel | | [22] | 654 | inventive |
| 403 | | | [23] | 691 | inventive |
| 404 | | | [24] | 668 | inventive |
| 405 | | | [25] | 531 | inventive |

TABLE 8-continued

| Sample No. | Base Material | Method | Composition No. | Number of Workable Holes (Holes) | Remarks |
|---|---|---|---|---|---|
| 406 | | | [26] | 702 | inventive |
| 407 | | | [27] | 850 | inventive |
| 408 | | | [28] | 765 | inventive |
| 409 | | | [29] | 454 | inventive |
| 410 | | | [30] | 431 | inventive |
| 411 | | | [31] | 424 | inventive |
| 412 | | | [32] | 412 | inventive |
| 413 | | | [33] | 423 | inventive |
| 414 | | | [34] | 454 | inventive |
| 415 | | | [35] | 350 | inventive |
| 416 | | | [36] | 350 | inventive |
| 417 | | | [37] | 415 | inventive |
| 418 | | | [38] | 398 | inventive |
| 419 | | | [39] | 426 | inventive |
| 420 | | | [40] | 447 | inventive |
| 421 | | | [41] | 398 | inventive |
| 422 | | | [42] | 426 | inventive |
| 423 | | | [43] | 113 | comparative |
| 424 | | | [44] | 89 | comparative |
| 425 | | | [45] | 106 | comparative |
| 426 | | | [46] | 98 | comparative |
| 427 | | | [47] | 108 | comparative |
| 428 | | | [48] | 102 | comparative |
| 429 | | | [49] | 85 | comparative |
| 430 | | | [50] | 75 | comparative |
| 431 | | | [51] | 95 | comparative |
| 432 | | | [52] | 97 | comparative |

In X-ray diffraction, a diffraction line from a (111) plane exhibited a high peak (maximum intensity) in each sample of the compositions Nos. [21] to [29]. It is understood from Tables 6 to 8 that the samples Nos. 401 to 408 provided with the films A and B in thicknesses of 0.5 nm to 50 nm had particularly large numbers of worked holes. This is conceivably because the films A and B were completely brought into face-centered cubic structures due to the so-called strain conformity. On the other hand, the number of worked holes was somewhat low in the sample No. 409 not provided with a TiN layer serving as an adhesion layer, although the film thickness was in the preferable range. In the samples Nos. 410 and 411, the numbers of worked holes were small conceivably because these samples were not provided with TiN films. Further, the numbers of worked holes were small conceivably because the thicknesses of the films A and B were out of the range of 0.5 to 50 nm in the samples Nos. 412 to 414, and conceivably because the thicknesses of the films A or B were out of the range of 0.5 to 500 nm in the samples Nos. 415 and 416. In addition, the numbers of worked holes were small conceivably because the films included structures other than fcc structures in the samples Nos. 417 and 418, and conceivably because the films were not oriented along (111) planes in the samples Nos. 419 to 422. On the other hand, the numbers of worked holes were extremely small in the samples Nos. 423 to 432 conceivably because the compositions or thicknesses of the films were out of the inventive ranges.

EXAMPLE 5

Wear-resistant coating films having the compositions Nos. [21] to [52] in Example 4 were formed by arc ion plating in a procedure similar to Example 2, to manufacture milling tips. The base materials of the tips were prepared from titanium carbo-nitride cermet. These tips were subjected to a cutting performance test in milling under the following cutting conditions:

Tip: SDKN42, JIS P10 titanium carbo-nitride cermet
Workpiece: SS41
Cutting Speed: 150 m/min.
Feed Rate: 0.15 mm/edge
Depth of Cut: 7.0 mm
Cutting Oil: dry type
Determination of Life: flank wear width at a cut length of 30 m Table 9 shows the results of the test.

TABLE 9

| Sample No. | Base Material | Method | Composition No. | Flank Wear Width (mm) | Remarks |
|---|---|---|---|---|---|
| 501 | cermet | arc IP | [21] | 0.11 | inventive |
| 502 | | | [22] | 0.12 | inventive |
| 503 | | | [23] | 0.10 | inventive |
| 504 | | | [24] | 0.12 | inventive |
| 505 | | | [25] | 0.10 | inventive |
| 506 | | | [26] | 0.13 | inventive |
| 507 | | | [27] | 0.12 | inventive |
| 508 | | | [28] | 0.09 | inventive |
| 509 | | | [29] | 0.18 | inventive |
| 510 | | | [30] | 0.21 | inventive |
| 511 | | | [31] | 0.20 | inventive |
| 512 | | | [32] | 0.19 | inventive |
| 513 | | | [33] | 0.16 | inventive |
| 514 | | | [34] | 0.17 | inventive |
| 515 | | | [35] | 0.18 | inventive |
| 516 | | | [36] | 0.21 | inventive |
| 517 | | | [37] | 0.22 | inventive |
| 518 | | | [38] | 0.19 | inventive |
| 519 | | | [39] | 0.23 | inventive |
| 520 | | | [40] | 0.25 | inventive |
| 521 | | | [41] | 0.25 | inventive |

TABLE 9-continued

| Sample No. | Base Material | Method | Composition No. | Flank Wear Width (mm) | Remarks |
|---|---|---|---|---|---|
| 522 | | | [42] | 0.23 | inventive |
| 523 | | | [43] | 0.44 | comparative |
| 524 | | | [44] | 0.42 | comparative |
| 525 | | | [45] | 0.48 | comparative |
| 526 | | | [46] | 0.57 | comparative |
| 527 | | | [47] | 0.65 | comparative |
| 528 | | | [48] | 0.80 | comparative |
| 529 | | | [49] | 0.95 | comparative |
| 530 | | | [50] | 0.76 | comparative |
| 531 | | | [51] | 0.88 | comparative |
| 532 | | | [52] | 0.64 | comparative |

It has been confirmed from Table 9 that the milling tips of the inventive samples Nos. 501 to 522 had smaller flank wear width and longer life as compared with those of the samples Nos. 523 to 530 which were out of the inventive ranges and conventional samples Nos. 531 and 532.

EXAMPLE 6

Wear-resistant coating films having the compositions Nos. [21] to [52] in Example 4 were formed by sputtering in a procedure similar to Example 2, to prepare turning tips. The base materials of the tips were prepared from $Al_2O_3$—TiC ceramics. These tips were subjected to a cutting performance test in continuous turning under the following conditions:
Tip: CNMN 433, JIS K01 $Al_2O_3$—TiC ceramics
Workpiece: FCD45
Cutting Speed: 300, 230 and 180 m/min.
Feed Rate: 0.1 mm/rev.
Depth of Cut: 0.3 mm
Cutting Oil: dry type
Determination of Life: flank wear width at a cut length of 50 m Table 10 shows the results of the test.

TABLE 10

| Sample No. | Base Material | Method | Composition No. | Flank Wear Width (mm) | Remarks |
|---|---|---|---|---|---|
| 601 | ceramic | sputtering | [21] | 0.09 | inventive |
| 602 | | | [22] | 0.08 | inventive |
| 603 | | | [23] | 0.07 | inventive |
| 604 | | | [24] | 0.06 | inventive |
| 605 | | | [25] | 0.08 | inventive |
| 606 | | | [26] | 0.09 | inventive |
| 607 | | | [27] | 0.08 | inventive |
| 608 | | | [28] | 0.09 | inventive |
| 609 | | | [29] | 0.12 | inventive |
| 610 | | | [30] | 0.13 | inventive |
| 611 | | | [31] | 0.14 | inventive |
| 612 | | | [32] | 0.15 | inventive |
| 613 | | | [33] | 0.16 | inventive |
| 614 | | | [34] | 0.14 | inventive |
| 615 | | | [35] | 0.15 | inventive |
| 616 | | | [36] | 0.16 | inventive |
| 617 | | | [37] | 0.15 | inventive |
| 618 | | | [38] | 0.14 | inventive |
| 619 | | | [39] | 0.18 | inventive |
| 620 | | | [40] | 0.17 | inventive |
| 621 | | | [41] | 0.17 | inventive |
| 622 | | | [42] | 0.18 | inventive |

TABLE 10-continued

| Sample No. | Base Material | Method | Composition No. | Flank Wear Width (mm) | Remarks |
|---|---|---|---|---|---|
| 623 | | | [43] | 0.51 | comparative |
| 624 | | | [44] | 0.62 | comparative |
| 625 | | | [45] | 0.38 | comparative |
| 626 | | | [46] | 0.76 | comparative |
| 627 | | | [47] | 0.88 | comparative |
| 628 | | | [48] | 0.64 | comparative |
| 629 | | | [49] | 0.85 | comparative |
| 630 | | | [50] | 0.74 | comparative |
| 631 | | | [51] | 0.77 | comparative |
| 632 | | | [52] | 0.76 | comparative |

From Table 10, it has been confirmed that the tips of the inventive samples Nos. 601 to 622 had smaller flank wear width and longer life as compared with the tips of the samples Nos. 623 to 630 which were out of the inventive ranges and conventional samples Nos. 631 and 632.

EXAMPLE 7

Drills having wear-resistant coating films of various compositions were prepared by arc ion plating in a procedure similar to Example 2. The base materials of the drills were prepared from JIS K10 cemented carbide. For the purpose of comparison, drills having base materials of the same materials and shapes as those of the inventive samples, which were coated with wear-resistant coating films containing no vanadium, were prepared. Further, drills having such wear-resistant coating films coated with molybdenum disulfide were prepared. The coatings of molybdenum disulfide were formed by sputtering. These drills were subjected to a cutting performance test in perforation work under the following cutting conditions:

Tool: φ10 mm, twist drill, JIS K10 cemented carbide
Workpiece: S50C
Cutting Speed: 70 m/min.
Feed Rate: 0.3 mm/rev.
Depth of Hole: 32 mm (blind hole)
Cutting Oil: dry type
Determination of Life: number of workable holes
Other Evaluation: change of inner diameter of worked hole and number of workable holes Table 11 shows the results of the test.

TABLE 11

| Sample No. | Presence/Absence of First TiN Layer | Thin Film Layer Structure Coating Film Structure | | | | | | | | | | | | |
|---|---|---|---|---|---|---|---|---|---|---|---|---|---|---|
| | | Film A | | | | | | | Film B | | | | | |
| | | Film Composition | | | | | | Thickness | Film Composition | | | | | Thickness |
| | | Ti | Al | V | C | N | O | (nm) | Ti | Al | V | C | N | O | (nm) |
| 701 | yes | 0.6 | 0.3 | 0.1 | 0 | 1 | 0 | 1.3 | 0 | 1 | 0 | 0 | 1 | 0 | 1.5 |
| 702 | yes | 0.6 | 0.3 | 0.1 | 0.3 | 0.7 | 0 | 4.5 | 0 | 0 | 1 | 0.3 | 0.7 | 0 | 3.5 |
| 703 | yes | 0.8 | 0.1 | 0.1 | 0 | 0.8 | 0.2 | 28 | 0 | 1 | 0 | 0 | 0.8 | 0.2 | 26 |
| 704 | yes | 0.9 | 0 | 0.1 | 0 | 1 | 0 | 2.3 | 0 | 0 | 1 | 0 | 1 | 0 | 2.1 |
| 705 | no | 0.8 | 0.1 | 0.1 | 0.3 | 0.7 | 0 | 20.2 | 0 | 0 | 1 | 0.3 | 0.7 | 0 | 12.3 |
| 706 | yes | single composition film of $(Ti_{0.4}Al_{0.5})$ (CN) containing no vanadium | | | | | | | | | | | | |
| 707 | yes | single composition film of $(Ti_{0.4}Al_{0.6})$ (CNO) containing no vanadium | | | | | | | | | | | | |
| 708 | yes | $(Ti_{0.5}Al_{0.5})N$ film coated with molybdenum disulfide | | | | | | | | | | | | |
| 709 | yes | $(Ti_{0.4}Al_{0.6})$ (CN) film coated with molybdenum disulfide | | | | | | | | | | | | |

| Sample No. | Composition Ratio of Component in Overall Film | | | | | | Total Thickness ($\mu$m) | Hole Diameter Accuracy in Working of 500 Holes | Number of Workable Holes (Holes) | Remarks |
|---|---|---|---|---|---|---|---|---|---|---|
| | Ti | Al | V | C | N | O | | | | |
| 701 | 0.28 | 0.67 | 0.05 | 0 | 1 | 0 | 3.3 | 0.010 | 850 | inventive |
| 702 | 0.34 | 0.17 | 0.49 | 0.3 | 0.7 | 0 | 3.9 | 0.015 | 790 | inventive |
| 703 | 0.41 | 0.54 | 0.05 | 0 | 0.8 | 0.2 | 4.2 | 0.012 | 950 | inventive |
| 704 | 0.47 | 0 | 0.53 | 0 | 1 | 0 | 4.0 | 0.014 | 880 | inventive |
| 705 | 0.5 | 0.06 | 0.44 | 0.3 | 0.7 | 0 | 4.8 | 0.023 | 523 | inventive |
| 706 | 0.4 | 0.6 | 0 | 0.5 | 0.5 | 0 | 4.1 | — | 140 | comparative |
| 707 | 0.4 | 0.6 | 0 | 0.3 | 0.5 | 0.2 | 4.5 | — | 165 | comparative |
| 708 | $(Ti_{0.5}Al_{0.5})N$ film coated with molybdenum disulfide | | | | | | 4.8 | — | 142 | comparative |
| 709 | $(Ti_{0.4}Al_{0.6})$ (CN) film coated with molybdenum disulfide | | | | | | 4.3 | — | 115 | comparative |

It has been confirmed from Table 11 that the drills of the inventive samples Nos. 701 to 705 were excellent not only in number of workable holes but in accuracy of the inner diameters of the worked holes. It has also been recognized that the sample No. 705 not provided with a TiN layer serving as an adhesion layer achieved a slightly lower number of workable holes and was inferior in accuracy as compared with the remaining inventive samples Nos. 701 to 704. On the other hand, each of the drills of comparative samples Nos. 706 and 707 was broken before working 500 holes. Therefore, it was impossible to measure accuracy of the inner diameters of the holes upon working of 500 holes. Further, each of the drills of the comparative samples Nos. 708 and 709 exhibited high accuracy of inner diameters up to working of 100 holes. When the number of worked holes exceeded 100, however, swarfs extended so abnormally that continuation of the test was dangerous, and hence the test was stopped. After the test, it has been proved that the drill lost the molybdenum disulfide coating serving as a lubricating film due to its wear and thus lost the lubricative effect, by examination of the surface state of the drill.

EXAMPLE 8

Wear-resistant coating films of various compositions were formed on base materials consisting of die steel in a procedure similar to Example 1. Adhesion strength values of the wear-resistant coating films were measured by a scratch test with a diamond indenter. Table 12 shows the results.

TABLE 12

| Sample No. | Base Material | Presence/Absence of First TiN Layer | Coating Film Composition | Scratch Critical Load (N) | Remarks |
|---|---|---|---|---|---|
| 801 | die | yes | $(Ti_{0.2}Al_{0.3}V_{0.5})N$ | 72 | inventive |
| 802 | steel | yes | $(Ti_{0.5}V_{0.5}) (C_{0.3}N_{0.7})$ | 76 | inventive |
| 803 | | yes | $(Ti_{0.4}Al_{0.5}V_{0.1}) (C_{0.2}N_{0.5}O_{0.3})$ | 74 | inventive |
| 804 | | no | $(Ti_{0.5}Al_{0.3}V_{0.2}) (C_{0.3}N_{0.6}O_{0.1})$ | 53 | inventive |

It has been recognized from Table 12 that the inventive samples Nos. 801 to 803 provided with TiN layers serving as adhesion layers had higher adhesion strength as compared with the sample No. 804 not provided with a TiN layer.

EXAMPLE 9

Wear-resistant coating films having various compositions were formed on base materials consisting of die steel in a procedure similar to Example 2. Adhesion strength values of the wear-resistant coating films were measured by a scratch test with a diamond indenter. Further, Knoop hardness values (measurement load: 25 g) of the wear-resistant coating films were measured. Table 13 shows the results.

TABLE 13

| Sample No. | Base material | Method | Presence/ Absence of First TiN Layer | Thin Film Layer Structure Coating Film Structure | | | | | | | | | | | | | |
|---|---|---|---|---|---|---|---|---|---|---|---|---|---|---|---|---|---|
| | | | | Film A | | | | | | | Film B | | | | | | |
| | | | | Film Composition | | | | | | Thickness | Film Composition | | | | | | Thickness |
| | | | | Ti | Al | V | C | N | O | (nm) | Ti | Al | V | C | N | O | (nm) |
| 901 | die steel | arc IP | yes | 0.6 | 0.3 | 0.1 | 0 | 1 | 0 | 3.0 | 0.2 | 0.2 | 0.6 | 0 | 1 | 0 | 2.0 |
| 902 | | | yes | 0.8 | 0.2 | 0 | 0.3 | 0.7 | 0 | 18.0 | 0.2 | 0 | 0.8 | 0.3 | 0.7 | 0 | 15.2 |
| 903 | | sputtering | yes | 0.9 | 0 | 0.1 | 0.2 | 0.8 | 0 | 6.0 | 0 | 1 | 0 | 0 | 1 | 0 | 2.5 |
| 904 | | | yes | 0.65 | 0.3 | 0.05 | 0.2 | 0.7 | 0.1 | 9.4 | 0 | 0 | 1 | 0.2 | 0.7 | 0.1 | 7.5 |
| 905 | | arc IP | no | 0.7 | 0.3 | 0 | 0 | 1 | 0 | 15.6 | 0 | 0 | 1 | 0 | 1 | 0 | 17.5 |
| 906 | | | yes | 0.7 | 0.3 | 0 | 0.3 | 0.5 | 0.2 | 0.3 | 0 | 0 | 1 | 0.3 | 0.5 | 0.2 | 0.2 |
| 907 | | | yes | 0.95 | 0 | 0.05 | 0.3 | 0.6 | 0.1 | 530.0 | 0 | 0 | 1 | 0.3 | 0.6 | 0.1 | 570.0 |
| 908 | | sputtering | yes | 0.95 | 0 | 0.05 | 0.3 | 0.6 | 0.1 | 0.4 | 0 | 0 | 1 | 0.3 | 0.6 | 0.1 | 0.3 |

| Sample No. | Composition Ratio of Component in Overall Film | | | | | | Total Thickness ($\mu$m) | Scratch Critical Load (N) | Hardness kg/mm$^2$ | Remarks |
|---|---|---|---|---|---|---|---|---|---|---|
| | Ti | Al | V | C | N | O | | | | |
| 901 | 0.44 | 0.26 | 0.3 | 0 | 1 | 0 | 1.6 | 72 | 3600 | inventive |
| 902 | 0.53 | 0.11 | 0.37 | 0.3 | 0.7 | 0 | 4.5 | 76 | 3200 | inventive |
| 903 | 0.64 | 0.29 | 0.07 | 0.14 | 0.86 | 0 | 7.0 | 69 | 3400 | inventive |
| 904 | 0.36 | 0.17 | 0.47 | 0.2 | 0.7 | 0.1 | 8.1 | 76 | 3250 | inventive |
| 905 | 0.33 | 0.14 | 0.53 | 0 | 1 | 0 | 3.0 | 38 | 3010 | inventive |
| 906 | 0.42 | 0.18 | 0.4 | 0.3 | 0.5 | 0.2 | 3.5 | 31 | 2160 | inventive |
| 907 | 0.46 | 0 | 0.54 | 0.3 | 0.6 | 0.1 | 4.9 | 27 | 1950 | inventive |
| 908 | 0.54 | 0 | 0.46 | 0.3 | 0.6 | 0.1 | 3.7 | 30 | 2100 | inventive |

It is understood from Table 13 that the samples Nos. 901 to 905 provided with films A and B in thicknesses which were in the range of 0.5 to 50 nm exhibited particularly high hardness. This is conceivably because the so-called strain conformity took place in the films A and B. The samples Nos. 906 to 908 provided with films A and B in thicknesses which were out of the range of 0.5 to 500 nm were slightly lower in hardness as compared with the samples Nos. 901 to 905. Among the samples Nos. 901 to 905 provided with the films A and B in thicknesses which were in the range of 0.5 to 50 nm, the samples Nos. 901 to 904 provided with TiN layers serving as adhesion layers were higher in adhesion as compared with the sample No. 905 not provided with a TiN layer.

EXAMPLE 10

Wear-resistant coating films having the compositions Nos. [1] to [20] in Table 4 were formed on base materials consisting of cemented carbide by arc ion plating in a procedure similar to Example 1, to prepare punches for cold forging. These punches were subjected to a life evaluation test in cold forging under the following conditions:

Punch Shape: forward end φ15 mm, JIS V40 cemented carbide
Workpiece: rod cut body of Cr—V steel
Part Name: socket wrench head
Forging Speed: 50 cycles/min.
Used Machine: press of 200 tons
Lubrication of Workpiece: no
Die: shrinkage-fitted in JIS V40 cemented carbide+steel case
Evaluation: workable quantity up to seizure
Table 14 shows the results.

TABLE 14

| Sample No. | Base material | Composition No. | Workable Quantity (thou.) | Remarks |
|---|---|---|---|---|
| 1001 | cemented | [1] | 120 | inventive |
| 1002 | carbide | [2] | 115 | inventive |
| 1003 | | [3] | 130 | inventive |
| 1004 | | [4] | 115 | inventive |
| 1005 | | [5] | 132 | inventive |
| 1006 | | [6] | 125 | inventive |
| 1007 | | [7] | 126 | inventive |
| 1008 | | [8] | 95 | inventive |
| 1009 | | [9] | 97 | inventive |
| 1010 | | [10] | 89 | inventive |
| 1011 | | [11] | 93 | inventive |
| 1012 | | [12] | 91 | inventive |
| 1013 | | [13] | 15 | comparative |
| 1014 | | [14] | 23 | comparative |
| 1015 | | [15] | 18 | comparative |
| 1016 | | [16] | 17 | comparative |
| 1017 | | [17] | 5 | comparative |
| 1018 | | [18] | 8 | comparative |
| 1019 | | [19] | 27 | comparative |
| 1020 | | [20] | 3 | comparative |

As understood from Table 14, the samples Nos. 1001 to 1007 provided with TiN layers serving as adhesion layers and having compositions and thicknesses which were in the inventive ranges and maximum intensity planes of X-ray diffraction in (111) planes exhibited particularly excellent results. The workable quantities of the samples Nos. 1008 and 1009 not provided with TiN films and the samples Nos. 1010 to 1013 having films that were not oriented on (111) planes were slightly reduced as compared with the samples Nos. 1001 to 1007. On the other hand, the workable quantities were remarkably small in the samples Nos. 1013 to 1018 and Nos. 1019 and 1021 having film compositions and film thicknesses which were out of the inventive ranges respectively.

Worn states of the punches of the samples Nos. 1017 to 1020 were observed in detail, to find that the forward end portions of these punches were chipped due to growth and falling off of deposits since forging was performed with no lubricants.

EXAMPLE 11

Wear-resistant coating films having the compositions Nos. [21] to [52] in Example 4 were formed on base materials consisting of hot die steel by sputtering in a procedure similar to Example 2, to prepare punches for warm forging. These punches were subjected to a life evaluation in warm forging under the following conditions:
Punch Shape: forward end φ80 mm, SKD61 hot die steel
Workpiece: S45C
Part Name: outer race of isokinetic ball joint
Temperature in Forging: 800° C.
Forging Speed: 50 cycles/min.
Used Machine: press of 1000 tons
Lubrication of Workpiece: with boric acid lubricant
Die: SKD61 hot die steel
Evaluation: workable quantity up to seizure
  Table 15 shows the results.

TABLE 15

| Sample No. | Base Material | Method | Composition No. | Workable Quantity (thou.) | Remark |
|---|---|---|---|---|---|
| 1101 | hot die | sputtering | [21] | 21 | inventive |
| 1102 | steel |  | [22] | 20 | inventive |
| 1103 | SKD61 |  | [23] | 19 | inventive |
| 1104 |  |  | [24] | 20 | inventive |
| 1105 |  |  | [25] | 19 | inventive |
| 1106 |  |  | [26] | 20 | inventive |
| 1107 |  |  | [27] | 21 | inventive |
| 1108 |  |  | [28] | 21 | inventive |
| 1109 |  |  | [29] | 13 | inventive |
| 1110 |  |  | [30] | 12 | inventive |
| 1111 |  |  | [31] | 14 | inventive |
| 1112 |  |  | [32] | 13 | inventive |
| 1113 |  |  | [33] | 15 | inventive |
| 1114 |  |  | [34] | 14 | inventive |
| 1115 |  |  | [35] | 13 | inventive |
| 1116 |  |  | [36] | 12 | inventive |
| 1117 |  |  | [37] | 13 | inventive |
| 1118 |  |  | [38] | 14 | inventive |
| 1119 |  |  | [39] | 16 | inventive |
| 1120 |  |  | [40] | 14 | inventive |
| 1121 |  |  | [41] | 12 | inventive |
| 1122 |  |  | [42] | 13 | inventive |
| 1123 |  |  | [43] | 8 | comparative |
| 1124 |  |  | [44] | 6 | comparative |
| 1125 |  |  | [45] | 7 | comparative |
| 1126 |  |  | [46] | 6 | comparative |
| 1127 |  |  | [47] | 8 | comparative |
| 1128 |  |  | [48] | 7 | comparative |
| 1129 |  |  | [49] | 9 | comparative |
| 1130 |  |  | [50] | 4 | comparative |
| 1131 |  |  | [51] | 5 | comparative |
| 1132 |  |  | [52] | 7 | comparative |

It has been recognized from Table 15 that the inventive samples Nos. 1101 to 1122 exhibited larger workable quantities as compared with samples Nos. 1123 to 1130 which were out of the inventive ranges and conventional samples Nos. 1131 and 1132.

Worn states of the punches of the samples Nos. 1123 to 1132 were observed in detail, to find that the forward end portions of these punches were broken by growth and falling off of deposits due to forging with boric acid lubricants having incomplete lubricating effects. This is conceivably the reason why the samples Nos. 1123 to 1132 had short lives.

EXAMPLE 12

Wear-resistant coating films having the compositions Nos. [21] to [52] in Example 4 were formed on base materials consisting of hot die steel by arc ion plating in a procedure similar to Example 2, to prepare punches for hot forging. These punches were subjected to a life evaluation test in actual hot punching under the following conditions:
Punch shape: forward end φ40 mm, SKD 61 hot die steel
Workpiece: SUJ2
Part Name: outer race of ball bearing
Temperature in Forging: 900° C.
Working Speed: 60 times/min.
Used Machine: press of 200 tons
Lubrication of Workpiece: with boric acid lubricant
Die: SKD61 hot die steel
Evaluation: workable quantity up to seizure
  Table 16 shows the results of the test.

TABLE 16

| Sample No. | Base Material | Method | Composition No. | Workable Quantity (thou.) | Remarks |
|---|---|---|---|---|---|
| 1201 | hot die | arc IP | [21] | 8 | inventive |
| 1202 | steel |  | [22] | 9 | inventive |
| 1203 | SKD61 |  | [23] | 8 | inventive |
| 1204 |  |  | [24] | 10 | inventive |
| 1205 |  |  | [25] | 9 | inventive |
| 1206 |  |  | [26] | 8 | inventive |
| 1207 |  |  | [27] | 9 | inventive |
| 1208 |  |  | [28] | 9 | inventive |
| 1209 |  |  | [29] | 7 | inventive |
| 1210 |  |  | [30] | 7 | inventive |
| 1211 |  |  | [31] | 6 | inventive |
| 1212 |  |  | [32] | 7 | inventive |
| 1213 |  |  | [33] | 5 | inventive |
| 1214 |  |  | [34] | 6 | inventive |
| 1215 |  |  | [35] | 6 | inventive |
| 1216 |  |  | [36] | 7 | inventive |
| 1217 |  |  | [37] | 5 | inventive |
| 1218 |  |  | [38] | 6 | inventive |
| 1219 |  |  | [39] | 6 | inventive |
| 1220 |  |  | [40] | 7 | inventive |
| 1221 |  |  | [41] | 6 | inventive |
| 1222 |  |  | [42] | 6 | inventive |
| 1223 |  |  | [43] | 3 | comparative |
| 1224 |  |  | [44] | 2 | comparative |
| 1225 |  |  | [45] | 3 | comparative |
| 1226 |  |  | [46] | 3 | comparative |
| 1227 |  |  | [47] | 2 | comparative |
| 1228 |  |  | [48] | 2 | comparative |
| 1229 |  |  | [49] | 3 | comparative |
| 1230 |  |  | [50] | 2 | comparative |
| 1231 |  |  | [51] | 3 | comparative |
| 1232 |  |  | [52] | 2 | comparative |

It has been recognized from Table 16 that the inventive samples Nos. 1201 to 1222 exhibited larger workable quantities than the samples Nos. 1223 to 1230 which were out of the inventive ranges and conventional samples Nos. 1231 and 1232.

EXAMPLE 13

Wear-resistant coating films having the compositions Nos. [21] to [52] in Example 4 were formed on base materials consisting of high-speed steel by sputtering in a procedure similar to Example 2, to prepare molds. These molds were subjected to a life evaluation test in cold punching under the following conditions:
Punch Shape: forward end φ30 mm, SKH9 high-speed steel
Workpiece: SS41 (thickness: 6 mm)
Part Name: transformer container
Working Speed: 120 times/min.
Used Machine: NC press of 50 tons
Lubrication of Workpiece: with press oil containing extreme pressure agent Die: SKH9 high-speed steel
Evaluation: workable quantity up to seizure
  Table 17 shows the results of the test.

TABLE 17

| Sample No. | Base Material | Method | Composition No. | Workable Quantity (thou.) | Remarks |
|---|---|---|---|---|---|
| 1301 | high- | sputtering | [21] | 135.00 | inventive |
| 1302 | speed | | [22] | 140.00 | inventive |
| 1303 | steel | | [23] | 133.00 | inventive |
| 1304 | (SKH9) | | [24] | 129.00 | inventive |
| 1305 | | | [25] | 128.00 | inventive |
| 1306 | | | [26] | 132.00 | inventive |
| 1307 | | | [27] | 129.00 | inventive |
| 1308 | | | [28] | 127.00 | inventive |
| 1309 | | | [29] | 110.00 | inventive |
| 1310 | | | [30] | 106.00 | inventive |
| 1311 | | | [31] | 105.00 | inventive |
| 1312 | | | [32] | 104.00 | inventive |
| 1313 | | | [33] | 107.00 | inventive |
| 1314 | | | [34] | 112.00 | inventive |
| 1315 | | | [35] | 113.00 | inventive |
| 1316 | | | [36] | 115.00 | inventive |
| 1317 | | | [37] | 112.00 | inventive |
| 1318 | | | [38] | 113.00 | inventive |
| 1319 | | | [39] | 104.00 | inventive |
| 1320 | | | [40] | 101.00 | inventive |
| 1321 | | | [41] | 102.00 | inventive |
| 1322 | | | [42] | 106.00 | inventive |
| 1323 | | | [43] | 51.00 | comparative |
| 1324 | | | [44] | 35.00 | comparative |
| 1325 | | | [45] | 32.00 | comparative |
| 1326 | | | [46] | 28.00 | comparative |
| 1327 | | | [47] | 26.00 | comparative |
| 1328 | | | [48] | 24.00 | comparative |
| 1329 | | | [49] | 34.00 | comparative |
| 1330 | | | [50] | 19.00 | comparative |
| 1331 | | | [51] | 15.00 | comparative |
| 1332 | | | [52] | 17.00 | comparative |

It has been recognized from Table 17 that the inventive samples Nos. 1301 to 1322 exhibited larger workable quantities than the samples Nos. 1323 to 1330 which were out of the inventive ranges and conventional samples Nos. 1331 and 1332.

EXAMPLE 14

A method of forming a coating film according to another aspect of the present invention is now described with reference to cathodic arc ion plating.

As shown in FIGS. 1 and 2, a prescribed base material 2 cleaned with a cleaning solution such as an organic solvent is set on the base material support 3 which is rotatable along arrow R. Evaporation sources consisting of alloys containing Ti, Al and V in prescribed ratios or the respective single metal components are set on the two metal evaporation sources 8 and 9.

The interior of the reaction vessel 1 is evacuated with a vacuum evacuation apparatus (not shown) so that the internal pressure is not more than $1 \times 10^{-3}$ Pa, and argon gas is fed from the material gas supply nozzle 4 and the base material 2 is heated with the base material heater 7. The base material 2 consisting of cemented carbide is preferably heated to a temperature of 550 to 600° C. After the temperature of the base material 2 is increased to the prescribed level, the flow rate of argon gas is so adjusted that the internal pressure of the reaction vessel 1 is 2.7 Pa (20 mTorr), and power of −1000 V is applied to the base material support 3 and the base material 2 from the dc power source 5 to generate argon plasma in the reaction vessel 1, for plasma-cleaning the surface of the base material 2. Due to the operation, soil and an oxide film are removed from the surface of the base material 2.

Then, argon gas is discharged from the reaction vessel 1, nitrogen gas is introduced from the material gas supply nozzle 4 so that the internal pressure of the reaction vessel 1 is 4.0 Pa (30 mTorr), and the voltage of the dc power source 5 is reduced to −200 V. Power of −30 V and 100 A is supplied from the cathodic arc power sources 6a and 6b to the metal evaporation sources 8 and 9, for generating ions of metal titanium, metal aluminum and metal vanadium from the surfaces of the evaporation sources 8 and 9. Then, Ti, Al and V of compositions responsive to the ratios in the alloys forming the evaporation sources 8 and 9 react with nitrogen contained in the atmosphere, to form an alloy containing Ti, Al and V in prescribed ratios or nitride films of the respective metals on the surface of the base material 2. Thus, a (Ti,Al,V)N film or single metal nitride films such as a TiN film and a VN film, for example, are obtained.

In order to obtain a carbo-nitride film, hydrocarbon gas such as methane gas may be fed from the material gas supply nozzle 4 into the reaction vessel 1.

For preparing each of inventive samples, power was supplied to an evaporation source consisting of only metal titanium, to form a titanium nitride (TiN) film in a prescribed thickness as a film adjacent to the surface of the base material 2. Thereafter power was supplied to an evaporation source of a Ti—V or Ti—V—Al alloy having a prescribed alloy composition to react the alloy with nitrogen gas or mixed gas of nitrogen gas and hydrocarbon gas. Thus, (Ti,V)N, (Ti,Al,V)(C,N), (Ti,Al,V)N and (Ti,V)(C,N) films of inventive samples 1 to 6 were formed in compositions shown in Table 18.

After formation of each coating film, the respective supply of power from the cathodic arc power sources 6a and 6b was stopped. Then, introduction of gas from the material gas supply nozzle 4 was stopped, thereafter supply of the dc power source 5 was stopped, and the base material heater 7 was turned off. Thereafter the base material 2 was cooled to a temperature of not more than 100° C., and taken out from the reaction vessel 1.

The base material 2 was prepared from grade JIS P30 cemented carbide in a tip shape of JIS SDKN42. For the purpose of comparison, titanium nitride films of comparative samples Nos. 2 and 4 and titanium aluminum nitride films of comparative samples Nos. 1, 3 and 5 were prepared in a method similar to the above.

The surfaces of the coating films of the inventive samples Nos. 1 to 3 were oxidized in the atmosphere at the temperature of 600° C. for 30 minutes while those of the inventive samples Nos. 4 to 6 were oxidized in an atmosphere containing vapor at the temperature of 400° C. for 30 minutes.

Wear resistance and deposition resistance in a cutting test were evaluated under the following cutting test conditions:
Cutting Method: face milling
Workpiece: JIS SKD61 hot die steel
Cutting Speed: 50 m/min.
Feed Rate: 0.18 mm/edge
Depth of Cut: 2.0 mm
Cutting Oil: dry type
Determination of Life: flank wear width at a cut length of 10 m (or cut length up to chipping)
  Table 18 shows the results of the cutting test.

TABLE 18

| No | Name | Thickness of TiN Film Adjacent to Base Material | Coating Film Structure | Total Thickness ($\mu$m) | Oxidation | Abrasion Loss in Cutting by 10 m (mm) | Cut Length up to Chipping (m) |
|---|---|---|---|---|---|---|---|
| 1 | inventive sample 1 | 0.4 | $(Ti_{0.7}V_{0.3})N$ | 3.2 | yes (in atmosphere) | 0.26 | at least 12 m |
| 2 | inventive sample 2 | 0.3 | $(Ti_{0.3}Al_{0.3}V_{0.4})(C_{0.4}N_{0.6})$ | 3.5 | | 0.21 | at least 12 m |
| 3 | inventive sample 3 | 0.5 | $(Ti_{0.3}Al_{0.3}V_{0.4})N$ | 3.4 | | 0.23 | at least 12 m |
| 4 | inventive sample 4 | 0.5 | $(Ti_{0.5}V_{0.5})(C_{0.5}N_{0.5})$ | 3 | yes (in vapor) | 0.24 | at least 12 m |
| 5 | inventive sample 5 | 0.4 | $(Ti_{0.3}Al_{06}V_{0.1})N$ | 3.3 | | 0.21 | at least 12 m |
| 6 | inventive sample 6 | 0.4 | $(Ti_{0.5}Al_{0.3}V_{0.2})(C_{0.5}N_{0.6})$ | 3.6 | | 0.26 | at least 12 m |
| 7 | comparative sample 1 | 0.5 | $(Ti_{0.4}Al_{0.7})N$ | 3.4 | no | 0.53 | 12 m |
| 8 | comparative sample 2 | — | TiN | 3.3 | no | chipped | 8 m |
| 9 | comparative sample 3 | 0.5 | $(Ti_{0.3}Al_{0.7})N$ | 3.2 | yes (in atmosphere) | 0.61 | 11 m |
| 10 | comparative sample 4 | — | TiN | 3.3 | yes (in vapor) | chipped | 6 m |
| 11 | comparative sample 5 | — | $(Ti_{0.3}Al_{0.6}V_{0.1})N$ | 3.1 | | 0.51 | 11 m |

As shown in Table 18, it was possible to suppress chipping of inserts in the coated cutting tools of the inventive samples, and it has been confirmed that the lives of these samples were longer than those of the cutting tools of the comparative samples coated with conventional coating films.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A coated tool comprising:
   a base material;
   a wear-resistant coating film formed on said base material; and
   an outermost coat of a low melting point oxide that contains vanadium oxide, has a melting point of not more than 1000° C., and is formed on an outermost surface of said wear-resistant coating film; wherein
   said wear-resistant coating film has an overall composition expressed as $(Ti_x,Al_y,V_z)(C_u,N_v,O_w)$, where x, y, z, u, v and w represent the atomic ratios of Ti, Al, V, C, N and O respectively, and where x+y+z=1, u+v+w=1, $0.2<x<1$, $0\leq y<0.8$, $0.02\leq z<0.6$, $0\leq u<0.7$, $0.3<v\leq 1$ and $0\leq w<0.5$;
   said wear-resistant coating film has a thickness of at least 0.5 $\mu$m and not more than 15 $\mu$m; and
   said wear-resistant coating film includes a plurality of stacked first films, which each have a respective composition expressed as $(Ti_a,Al_b,V_c)(C_d,N_e,O_f)$, where a, b, c, d, e and f represent the atomic ratios of Ti, Al, V, C, N and O respectively, and where a+b+c=1, d+e+f=1, $0.2<a<1$, $0\leq b<0.8$, $0\leq c<0.6$, $0\leq d<0.7$, $0.3<e\leq 1$ and $0\leq f<0.5$.

2. The coated tool in accordance with claim 1, wherein each said first film respectively has a thickness of at least 0.5 nm and not more than 500 nm.

3. The coated tool in accordance with claim 2, wherein the thickness of each said first film is at least 0.5 nm and not more than 50 nm.

4. The coated tool in accordance with claim 3, wherein said wear-resistant coating film has a face-centered cubic structure, and exhibits a diffraction line pattern when examined by $\theta$–2$\theta$ X-ray diffraction, which includes only diffraction lines derived from a single type of face-centered cubic structure, and a diffraction line from a (111) plane has a maximum relative intensity among said diffraction lines.

5. The coated tool in accordance with claim 3, wherein the composition or the thickness of each one of said first films is different from the composition or the thickness of the other ones of said first films.

6. The coated tool in accordance with claim 1, wherein said wear-resistant coating film further includes at least one second film stacked with said first films, and said second film contains at least one component selected from a group consisting of vanadium nitride, vanadium carbide, vanadium carbo-nitride, vanadium carbo-oxide, vanadium oxy-nitride and vanadium carbo-oxy-nitride.

7. The coated tool in accordance with claim 6, wherein said first and second films each respectively have a thickness of at least 0.5 nm and not more than 500 nm.

8. The coated tool in accordance with claim 7, wherein the thickness of each of said first and second films is at least 0.5 nm and not more than 50 nm.

9. The coated tool in accordance with claim 6, wherein said first and second films are alternately stacked with each other.

10. The coated tool in accordance with claim 1, wherein said wear-resistant coating film further includes at least one third film stacked with said first films, said third film contains at least one component selected from a group consisting of aluminum nitride and aluminum carbo-nitride, and said third film has a thickness of at least 0.5 nm and not more than 50 nm.

11. The coated tool in accordance with claim 10, wherein said first and third films are alternately stacked with each other.

12. The coated tool in accordance with claim 1, wherein said wear-resistant coating film further includes an adhesion layer consisting of TiN arranged in contact with said base material.

13. The coated tool in accordance with claim 1, wherein said base material contains at least one component selected from a group consisting of ceramics, cemented carbide, cermet, high-speed steel, die steel, prehardened steel and precipitation-hardened stainless steel.

14. The coated tool in accordance with claim 1, wherein said wear-resistant coating film has a face-centered cubic structure, and exhibits a diffraction line pattern when examined by θ–2θ X-ray diffraction, which includes a diffraction line from a (111) plane that has a maximum relative intensity among all diffraction lines included in said diffraction line pattern.

15. The coated tool in accordance with claim 1, being a coated cutting tool.

16. The coated tool in accordance with claim 1, being a coated mold.

17. A coated cutting tool comprising:
a base material consisting of cemented carbide;
a wear-resistant coating film formed on a surface of said base material; and
an outermost coat of a low melting point oxide that contains vanadium oxide, has a melting point of not more than 1000° C., and is formed on an outermost surface of said wear-resistant coating film;
wherein said wear-resistant coating film includes:
a titanium nitride film that is formed in contact with said surface of said base material and that consists of titanium, nitrogen and a trace amount of unavoidable impurities; and
a composite nitride film that is formed on said titanium nitride film and that consists of titanium, vanadium, nitrogen and a trace amount of unavoidable impurities.

18. The coated cutting tool in accordance with claim 17, wherein said base material has a configuration including a flank, a rake face and an edge part at a boundary between said flank and said rake face, and wherein said surface on which said wear-resistant coating film is formed is any one of said flank, said rake face and said edge part.

19. The coated cutting tool in accordance with claim 17, wherein an atomic ratio of (vanadium)/{(titanium)+(vanadium)} in said composite nitride film is at least 0.02 and not more than 0.6.

20. A method of manufacturing the coated cutting tool in accordance with claim 17, comprising the steps of:
forming said composite nitride film on said titanium nitride film by PVD using an evaporation source of titanium and vanadium or an alloy of titanium and vanadium, and a reaction gas containing at least nitrogen; and
oxidizing a surface of said composite nitride film corresponding to said outermost surface of said wear-resistant coating film by heat treatment in an atmosphere containing oxygen or vapor at a temperature of at least 400° C. for forming said outermost coat of said low melting point oxide.

21. A coated cutting tool comprising:
a base material consisting of cemented carbide;
a wear-resistant coating film formed on a surface of said base material; and
an outermost coat of a low melting point oxide that contains vanadium oxide, has a melting point of not more than 1000° C., and is formed on an outermost surface of said wear-resistant coating film;
wherein said wear-resistant coating film includes:
a titanium nitride film that is formed in contact with said surface of said base material and that consists of titanium, nitrogen and a trace amount of unavoidable impurities; and
a composite nitride film that is formed on said titanium nitride film and that consists of titanium, aluminum, vanadium, nitrogen and a trace amount of unavoidable impurities.

22. The coated cutting tool in accordance with claim 21, wherein said base material has a configuration including a flank, a rake face and an edge part at a boundary between said flank and said rake face, and wherein said surface on which said wear-resistant coating film is formed is any one of said flank, said rake face and said edge part.

23. The coated cutting tool in accordance with claim 21, wherein an atomic ratio of (vanadium)/{(titanium)+(aluminum)+(vanadium)} in said composite nitride film is at least 0.02 and not more than 0.6.

24. A method of manufacturing the coated cutting tool in accordance with claim 21, comprising the steps of:
forming said composite nitride film on said titanium nitride film by PVD using an evaporation source of titanium, aluminum and vanadium or an alloy of a combination of at least two of titanium, aluminum and vanadium, and a reaction gas containing at least nitrogen; and
oxidizing a surface of said composite nitride film corresponding to said outermost surface of said wear-resistant coating film by heat treatment in an atmosphere containing oxygen or vapor at a temperature of at least 400° C. for forming said outermost coat of said low melting point oxide.

25. A coated cutting tool comprising:
a base material consisting of cemented carbide;
a wear-resistant coating film formed on a surface of said base material; and
an outermost coat of a low melting point oxide that contains vanadium oxide, has a melting point of not more than 1000° C., and is formed on an outermost surface of said wear-resistant coating film;
wherein said wear-resistant coating film includes:
a titanium nitride film that is formed in contact with said surface of said base material and that consists of titanium, nitrogen and trace amounts of unavoidable impurities; and
a composite carbo-nitride film that is formed on said titanium nitride film and that consists of titanium, vanadium, carbon, nitrogen and trace amounts of unavoidable impurities.

26. A method of manufacturing the coated cutting tool in accordance with claim 25, comprising the steps of:
forming said composite carbo-nitride film on said titanium nitride film by PVD using an evaporation source of titanium and vanadium or an alloy of titanium and vanadium, and a reaction gas containing at least nitrogen and a hydrocarbon; and
oxidizing a surface of said composite carbo-nitride film corresponding to said outermost surface of said wear-resistant coating film by heat treatment in an atmosphere containing oxygen or vapor at a temperature of at least 400° C. for forming said outermost coat of said low melting point oxide.

27. The coated cutting tool in accordance with claim 25, wherein an atomic ratio of (vanadium)/{(titanium)+(vanadium)} in said composite carbo-nitride film is at least 0.02 and not more than 0.6.

28. A coated cutting tool comprising:
a base material consisting of cemented carbide;

a wear-resistant coating film formed on a surface of said base material; and an outermost coat of a low melting point oxide that contains vanadium oxide, has a melting point of not more than 1000° C., and is formed on an outermost surface of said wear-resistant coating film;

wherein said wear-resistant coating film includes:
   a titanium nitride film that is formed in contact with said surface of said base material and that consists of titanium, nitrogen and a trace amount of unavoidable impurities; and
   a composite carbo-nitride film that is formed on said titanium nitride film and that consists of titanium, aluminum, vanadium, carbon, nitrogen and a trace amount of unavoidable impurities.

29. A method of manufacturing the coated cutting tool in accordance with claim 28, comprising the steps of:
   forming said composite carbo-nitride film on said titanium nitride film by PVD using an evaporation source of titanium, aluminum and vanadium or an alloy of a combination of at least two of titanium, aluminum and vanadium, and a reaction gas containing at least nitrogen and a hydrocarbon; and
   oxidizing a surface of said composite carbo-nitride film corresponding to said outermost surface of said wear-resistant coating film by heat treatment in an atmosphere containing oxygen or vapor at a temperature of at least 400° C. for forming said outermost coat of said low melting point oxide.

* * * * *

UNITED STATES PATENT AND TRADEMARK OFFICE
CERTIFICATE OF CORRECTION

PATENT NO. : 5,981,049
DATED : Nov. 9, 1999
INVENTOR(S) : Hisanori Ohara et al.

It is certified that error appears in the above-identified patent and that said Letters Patent is hereby corrected as shown below:

Col. 3, line 20, before "whose" replace "$Fe_2O_3.V_2O_5$" by --$Fe_2O_3 \cdot V_2O_5$--;
line 21, after "860°C.," replace "$Cr_2O_3.V_2O_5$" by --$Cr_2O_3 \cdot V_2O_5$--;
line 23, before "whose" replace "$3NiO.V_2O_5$" by --$3NiO \cdot V_2O_5$--;

Col. 10, line 41, after "of" replace "$Fe_2O_3.V_2O_5$" by --$Fe_2O_3 \cdot V_2O_5$
line 42, before "and" (first occurrence) replace "$Cr_2O_3.V_2O_5$" by --$Cr_2O_3 \cdot V_2O_5$--; after "and" (first occurrence) replace "$3NiO.V_2O_5$" by --$3NiO \cdot V_2O_5$--;

Col. 36, line 34, after "claim" replace "3" by -- 2 --;

Signed and Sealed this

Fourth Day of July, 2000

Attest:

Q. TODD DICKINSON

*Attesting Officer*  *Director of Patents and Trademarks*